(12) United States Patent
Chen et al.

(10) Patent No.: US 12,029,123 B2
(45) Date of Patent: Jul. 2, 2024

(54) SEMICONDUCTOR STRUCTURE AND METHOD OF MANUFACTURING A SEMICONDUCTOR STRUCTURE

(71) Applicant: TAIWAN SEMICONDUCTOR MANUFACTURING COMPANY, LTD., Hsinchu (TW)

(72) Inventors: Yu-Hao Chen, Hsinchu (TW); Hui Yu Lee, Hsinchu (TW); Jui-Feng Kuan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 17/237,607

(22) Filed: Apr. 22, 2021

(65) Prior Publication Data

US 2022/0246818 A1    Aug. 4, 2022

Related U.S. Application Data

(60) Provisional application No. 63/143,524, filed on Jan. 29, 2021.

(51) Int. Cl.
*H10N 10/17* (2023.01)
*H01L 23/38* (2006.01)
(Continued)

(52) U.S. Cl.
CPC ............ *H10N 10/17* (2023.02); *H01L 23/38* (2013.01); *H01L 25/167* (2013.01); *H10N 10/01* (2023.02); *H10N 10/80* (2023.02)

(58) Field of Classification Search
CPC ........ H10N 10/17; H10N 10/80; H10N 10/01; H01L 23/38; H01L 25/167
See application file for complete search history.

(56) References Cited

U.S. PATENT DOCUMENTS

2015/0147026 A1*  5/2015  Svilans .................... G02B 6/35
                                                        385/16
2017/0229373 A1    8/2017  Kim et al.

FOREIGN PATENT DOCUMENTS

| CN | 104425408 | 3/2015 |
| TW | 201041194 | 11/2010 |
| WO | 2007015701 | 2/2007 |

OTHER PUBLICATIONS

Office Action dated Oct. 4, 2021 for corresponding case No. TW 11020963440. (pp. 1-4).

* cited by examiner

*Primary Examiner* — Tae-Sik Kang
(74) *Attorney, Agent, or Firm* — Hauptman Ham, LLP

(57) ABSTRACT

A semiconductor structure includes an optical component and a thermal control mechanism adjacent to the optical component and configured to control a temperature of the optical component. The thermal control mechanism includes a conductive structure, a first thermoelectric member and a second thermoelectric member opposite to the first thermoelectric member. The first thermoelectric member and the second thermoelectric member are electrically connected to the conductive structure. The first thermoelectric member and the second thermoelectric member have opposite conductive types. The semiconductor structure further includes a first dielectric layer surrounding the optical component and a portion of the thermal control mechanism, wherein the conductive structure is over the first dielectric layer, and the first thermoelectric member and the second thermoelectric member are surrounded by the first dielectric layer. The semiconductor structure further includes a first via extending through the first dielectric layer and electrically connected to the conductive structure.

19 Claims, 19 Drawing Sheets

(51) Int. Cl.
*H01L 25/16* (2023.01)
*H10N 10/01* (2023.01)
*H10N 10/80* (2023.01)

SEMICONDUCTOR STRUCTURE AND METHOD OF MANUFACTURING A SEMICONDUCTOR STRUCTURE

CROSS-REFERENCE TO RELATED APPLICATIONS

This application claims priority of U.S. provisional application Ser. No. 63/143,524 filed Jan. 29, 2021, the disclosure of which is hereby incorporated by reference in its entirety.

BACKGROUND

The semiconductor industry has experienced rapid growth due to ongoing improvements in integration density of a variety of components (e.g., photoelectric devices, electrical components, etc.). To accommodate the miniaturized scale of the semiconductor devices, various technologies and applications have been developed for wafer-level packaging, involving greater numbers of different components with different functions. Improvement in integration density has resulted from iterative reduction of minimum feature size, which allows more components to be integrated into a given area.

As such, fabrication of the semiconductor device involves many steps and operations on such a small and thin semiconductor device. Therefore, the manufacturing of the semiconductor device at a miniaturized scale becomes more complicated. Further, greater numbers of different components with different materials are involved, resulting in greater demands on thermal management and heat dissipation efficiency due to high power density of the semiconductor device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
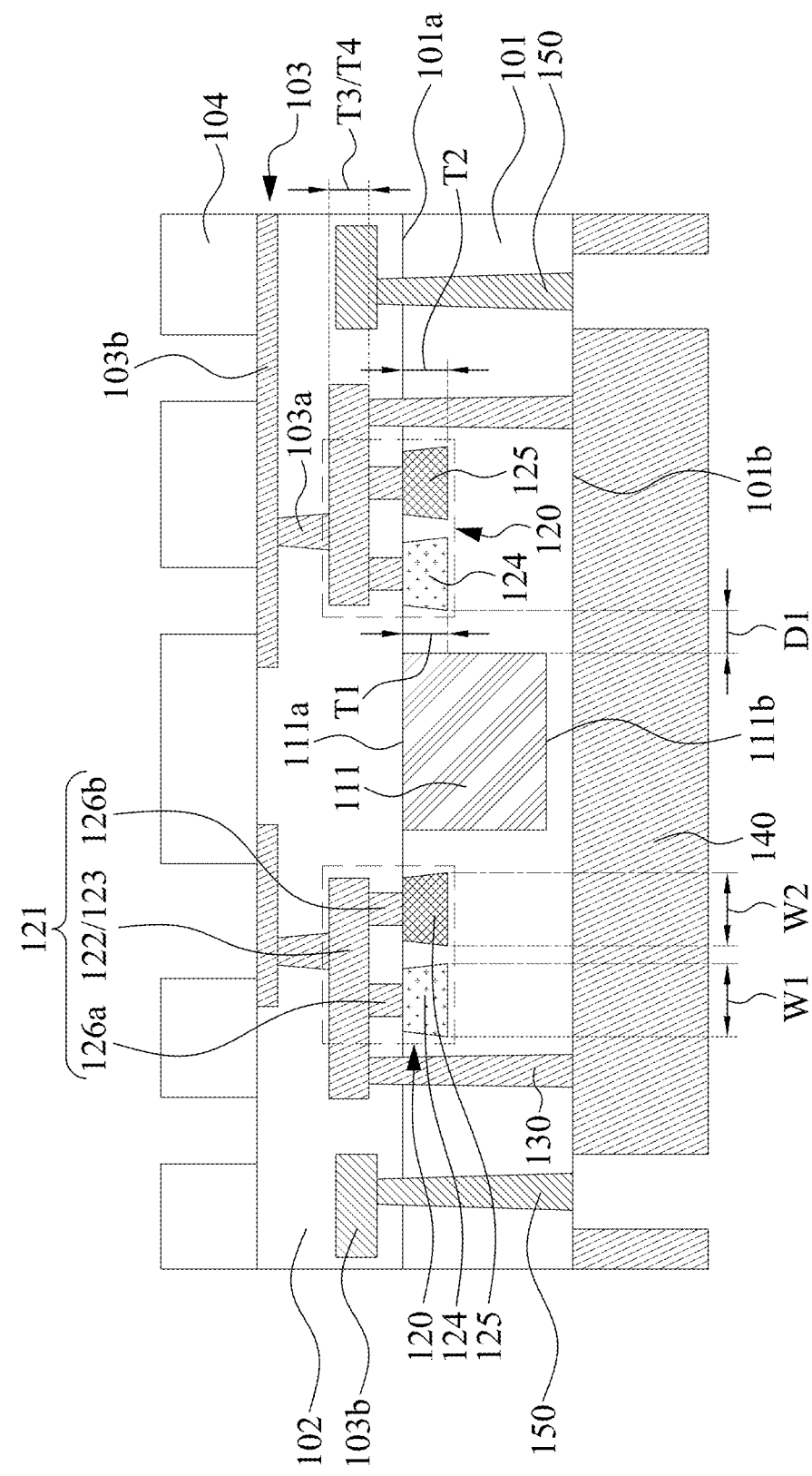
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. In addition, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allow the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase yield and decrease costs.

A semiconductor structure is manufactured using a number of operations. During the manufacturing of the semiconductor structure, components such as semiconductor chips or dies with different functionalities and dimensions are stacked over each other and integrated into a single module. The component is disposed on a substrate or another component, and a molding is formed to encapsulate the components. During operation of the semiconductor structure, each of the components emit heat in some instances. If the accumulated heat inside the semiconductor structure reaches a certain temperature, performance of the component is diminished in some instances, especially if the component is a thermally-sensitive optical component. Reliability and performance of the semiconductor structure would be adversely affected. Therefore, a heat dissipation mechanism included in the semiconductor structure helps to dissipate the heat to the surrounding environment and maintain the operating efficiency of the semiconductor structure.

In the present disclosure, a semiconductor structure and a method of manufacturing a semiconductor structure are provided. In particular, a semiconductor structure including an optical component, a thermal control mechanism, a first dielectric layer and a first via is disclosed below. A semiconductor structure including an optical component, an electrical component, a thermal control mechanism, a thermal sensing circuit and a first dielectric layer is also disclosed below. In addition, a method of manufacturing a semiconductor structure including the optical component and the thermal control mechanism is also disclosed below. Other features and processes are also included in some embodiments. The semiconductor structure includes the thermal control mechanism configured to control a temperature of the optical component, in order to improve the performance of the optical component.

The thermal control mechanism are able to direct heat emitted from the optical component toward a periphery of the semiconductor structure. The heat is able to be effectively and efficiently dissipated to the surrounding by the thermal control mechanism. As such, performance of the semiconductor structure is maintained or enhanced.

Figure 2:
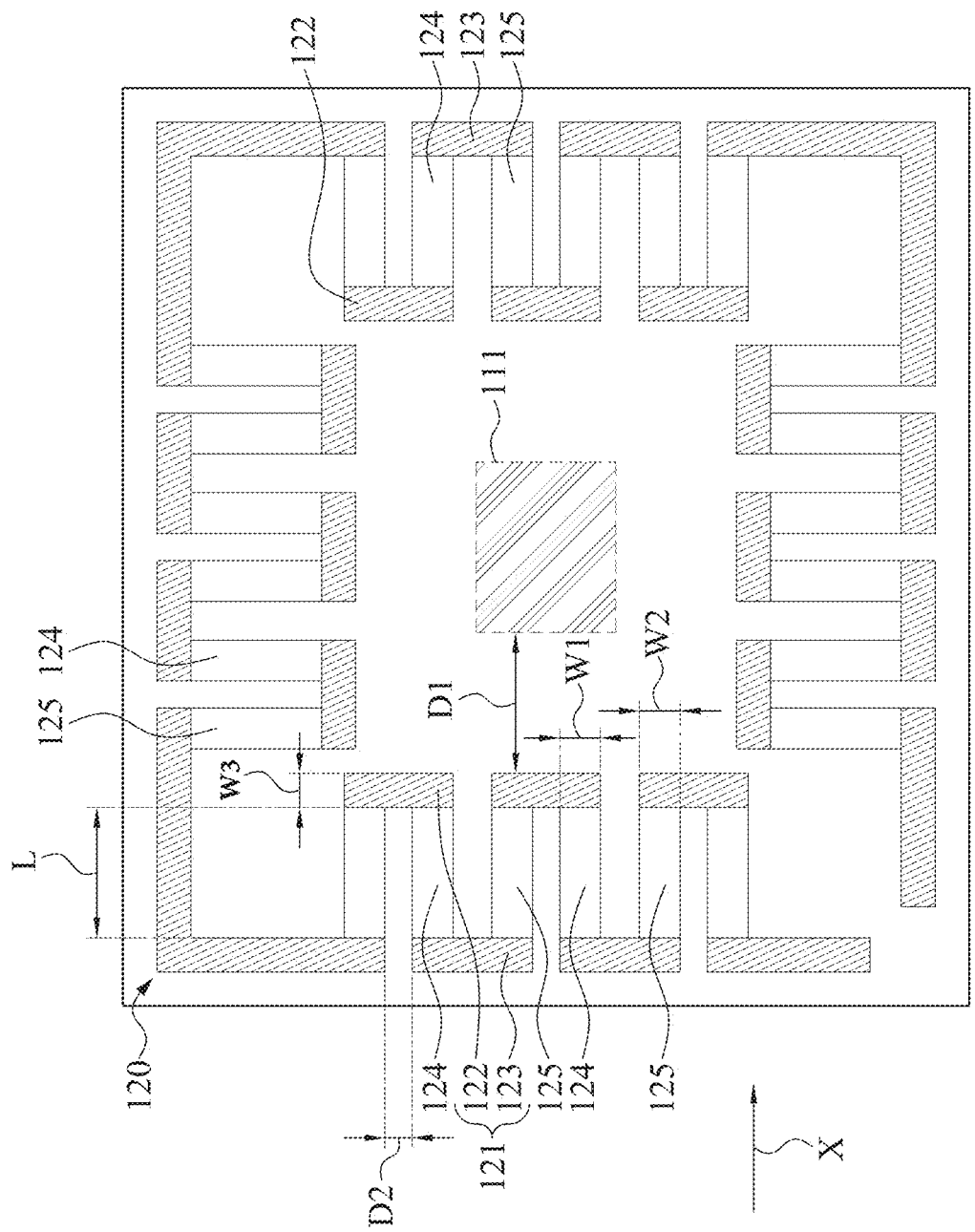
FIG. 2 is an enlarged top view of a portion of the semiconductor structure in FIG. 1.

FIG. 1 is a cross-sectional view of a semiconductor structure 100 in accordance with some embodiments of the present disclosure. FIG. 2 is an enlarged top view of a thermal control mechanism 120 in FIG. 1. In some embodiments, referring to FIGS. 1 and 2, the semiconductor structure 100 includes an optical component 111, the thermal control mechanism 120, a first dielectric layer 101, and a first via 130.

In some embodiments, the optical component 111 is surrounded by the first dielectric layer 101. In some embodiments, the optical component 111 is configured to transmit an optical or light signal. In some embodiments, the optical component 111 includes a first surface 111a and a second surface 111b opposite to the first surface 111a. In some embodiments, the first surface 111a of the optical component 111 is at a same level as a third surface 101a of the first dielectric layer 101. In some embodiments, the first surface 111a of the optical component 111 is exposed by the third surface 101a of the first dielectric layer 101. In some embodiments, the first surface 111a of the optical component 111 is lower than the third surface 101a of the first dielectric layer 101. In some embodiments, the first surface 111a of the optical component 111 is a front side of the optical component 111. In some embodiments, the second surface 111b is a back side of the optical component 111. The optical component 111 is capable of performing various operations, such as transmitting or processing an optical signal. In some embodiments, the optical component 111 includes photoelectric devices such as modulators, phase shifters, photodiode, waveguides, detectors, gratings, and/or couplers. In some embodiments, the optical component 111 includes silicon or the like.

In some embodiments, the first dielectric layer 101 surrounds the optical component 111. In some embodiments, the first dielectric layer 101 is in contact with a sidewall of the optical component 111. In some embodiments, the first dielectric layer 101 is not in contact with the first surface 111a of the optical component 111.

In some embodiments, the first dielectric layer 101 includes low-k dielectric material. The dielectric constant (k value) of the low-k dielectric material is be lower than 3.0, or lower than about 2.5, and the dielectric material is therefore also referred to as an extreme low-k (ELK) dielectric material. In some embodiments, the first dielectric layer 101 includes a dielectric material with a refractive index lower than a refractive index of the optical component 111. In some embodiments, the first dielectric layer 101 includes silicon dioxide or the like. In some embodiments, the first dielectric layer 101 includes a polymer, such as polyimide, polybenzoxazole (PBO) or the like. In some embodiments, the first dielectric layer 101 includes a single-layer film or a composite stack including a plurality of dielectric sub-layers. In some embodiments, the dielectric sub-layers are comprised of the same material or different materials.

In some embodiments, a second dielectric layer 102 is disposed over the optical component 111 and the first dielectric layer 101. In some embodiments, the second dielectric layer 102 is in contact with the first surface 111a of the optical component 111. In some embodiments, the second dielectric layer 102 is disposed on the third surface 101a of the first dielectric layer 101. In some embodiments, the second dielectric layer 102 is not in contact with the first surface 111a of the optical component 111.

In some embodiments, the second dielectric layer 102 includes low-k dielectric material. In some embodiments, the second dielectric layer 102 includes a dielectric material with a refractive index lower than the refractive index of the optical component 111. In some embodiments, the second dielectric layer 102 includes silicon dioxide or the like. In some embodiments, the second dielectric layer 102 includes a polymer, such as polyimide, polybenzoxazole (PBO) or the like. In some embodiments, the second dielectric layer 102 includes a single-layer film or a composite stack including a plurality of dielectric sub-layers. In some embodiments, the dielectric sub-layers are comprised of the same material or different materials. In some embodiments, the first dielectric layer 101 and the second dielectric layer 102 are comprised of the same material or different materials.

In some embodiments, the first via 130 extends through the first dielectric layer 101. In some embodiments, a plurality of first vias 130 extend through the first dielectric layer 101. In some embodiments, the first via 130 is disposed within the first dielectric layer 101. In some embodiments, an end of the first via 130 at least partially extends outside of the first dielectric layer 101. In some embodiments, the first via 130 protrudes from the first dielectric layer 101. In some embodiments, the second dielectric layer 102 surrounds a protruding portion of the first via 130. In some embodiments, the thermal control mechanism 120 is disposed between the first via 130 and the optical component 111.

In some embodiments, the first via 130 includes a conductive material such as gold, silver, copper, nickel, tungsten, aluminum, tin and/or alloys thereof. In some embodiments, the first via 130 is a through dielectric via (TDV). In some embodiments, a height of the first via 130 is substantially equal to a thickness of the first dielectric layer 101. In some embodiments, the height of the first via 130 is substantially greater than the thickness of the first dielectric layer 101.

In some embodiments, a diameter of the first via 130 is between about 2 µm and about 50 µm. When the diameter of the first via 130 is higher than 50 µm, the cost of the semiconductor structure 100 is too high; when the diameter of the first via 130 is less than 2 µm, the resistance of the first via 130 is too high. In some embodiments, the diameter of the first via 130 is between about 10 µm and about 25 µm. In some embodiments, a length of the first via 130 is between about 5 µm and about 500 µm. When the length of the first via 130 is higher than 500 µm, the cost of the semiconductor structure 100 is too high; when the length of the first via 130 is less than 5 µm, the first dielectric layer 101 is too thin for manufacturing. In some embodiments, the length of the first via 130 is between about 20 µm and about 250 µm.

In some embodiments, the thermal control mechanism 120 is disposed adjacent to the optical component 111 and configured to dissipate heat from the optical component 111 to a periphery of the semiconductor structure 100 or to the surrounding. In some embodiments, the thermal control mechanism 120 is configured to transfer heat from the optical component 111 to another portion, or another component, of the semiconductor structure 100. In some embodiments, the thermal control mechanism 120 includes a thermoelectric cooler (TEC). In some embodiments, the thermal control mechanism 120 is disposed in the first dielectric layer 101 and/or the second dielectric layer 102.

In some embodiments, a distance D1 between the thermal control mechanism 120 and the optical component 111 is between about 0.01 µm and about 1.0 µm. When the distance D1 is less than 0.01 µm, the cost of the semiconductor structure 100 is too high; when the distance D1 is greater than 1.0 µm, the efficiency of the thermal control mechanism 120 for transferring heat from the optical component 111 is too low. In some embodiments, as shown in FIGS. 1 and 2, the thermal control mechanism 120 and the optical component 111 are disposed along an X direction. In some embodiments, as shown in FIG. 2, the thermal control mechanism 120 surrounds the optical component 111 in a top view. In some embodiments, the thermal control mechanism 120 and the optical component 111 are laterally offset in the top view.

In some embodiments, referring to FIGS. 1 and 2, the thermal control mechanism 120 includes a conductive structure 121 electrically connected to the first via 130 and disposed over the first dielectric layer 101. In some embodiments, the conductive structure 121 includes conductive material such as copper or the like. In some embodiments, the thermal control mechanism 120 electrically connects to the plurality of first vias 130. In some embodiments, the thermal control mechanism 120 further includes a first thermoelectric member 124 and a second thermoelectric member 125 opposite to the first thermoelectric member 124. In some embodiments, the first thermoelectric member 124 and the second thermoelectric member 125 are surrounded by the first dielectric layer 101, are electrically connected to the conductive structure 121, and have different conductive types. In some embodiments, the first thermoelectric member 124 and the second thermoelectric member 125 have opposite conductive types.

In some embodiments, the first thermoelectric member 124 and the second thermoelectric member 125 have different Seebeck coefficients. In some embodiments, the first thermoelectric member 124 includes p-type thermoelectric material, and the second thermoelectric member 125 includes n-type thermoelectric material. In some embodiments, the first thermoelectric member 124 includes n-type thermoelectric material, and the second thermoelectric member 125 includes p-type thermoelectric material. In some embodiments, the first thermoelectric member 124 is a P junction, and the second thermoelectric member 125 is an N junction. In some embodiments, the first thermoelectric member 124 includes copper or the like. In some embodiments, the second thermoelectric member 125 includes bismuth telluride ($Bi_2Te_3$), lead telluride (PbTe) or the like.

In some embodiments, the conductive structure 121 is disposed over the first thermoelectric member 124 and the second thermoelectric member 125. In some embodiments, the conductive structure 121 is disposed over the first via 130. In some embodiments, the conductive structure 121 is disposed over the third surface 101a of the first dielectric layer 101. In some embodiments, the conductive structure 121 is surrounded by the second dielectric layer 102. In some embodiments, the conductive structure 121 is configured to connect to an electrical source.

In some embodiments, the conductive structure 121 includes a first conductive member 122 and a second conductive member 123 opposite to the first conductive member 122. In some embodiments, the first thermoelectric member 124 and the second thermoelectric member 125 are disposed between the first conductive member 122 and the second conductive member 123. In some embodiments, the first conductive member 122, the second conductive member 123, the first thermoelectric member 124 and the second thermoelectric member 125 are connected in series. In some embodiments, the second dielectric layer 102 surrounds the first conductive member 122 and the second conductive member 123. In some embodiments, the first conductive member 122 and the second conductive member 123 extend laterally within the second dielectric layer 102.

In some embodiments, the first conductive member 122 and the second conductive member 123 extend parallel to each other. In some embodiments, the first conductive member 122 and the second conductive member 123 are disposed over the first thermoelectric member 124 and the second thermoelectric member 125. In some embodiments, the first conductive member 122 and the second conductive member 123 are disposed over the first via 130, and one of the first conductive member 122 and the second conductive member 123 is electrically connected to the first via 130. In some embodiments, the first conductive member 122 and the second conductive member 123 include conductive material such as gold, silver, copper, nickel, tungsten, aluminum, tin and/or alloys thereof.

In some embodiments, a width W1 of the first thermoelectric member 124 is between about 0.04 µm and about 100 µm. When the width W1 is higher than 100 µm, the cost of the semiconductor structure 100 is too high; when the width W1 is less than 0.04 µm, the resistance of the first thermoelectric member 124 is too high. In some embodiments, the width W1 of the first thermoelectric member 124 is between about 0.04 µm and about 10 µm. In some embodiments, a width W2 of the second thermoelectric member 125 is between about 0.04 µm and about 100 µm. Similarly, when the width W2 is higher than 100 µm, the cost of the semiconductor structure 100 is too high; when the width W2 is less than 0.04 µm, the resistance of the second thermoelectric member 125 is too high. In some embodiments, the width W2 of the second thermoelectric member 125 is between about 0.04 µm and about 10 µm. In some embodiments, the width W1 of the first thermoelectric member 124 is substantially equal to the width W2 of the second thermoelectric member 125. In some embodiments, the width W1 of the first thermoelectric member 124 is different from the width W2 of the second thermoelectric member 125.

In some embodiments, a first thickness T1 of the first thermoelectric member 124 and a second thickness T2 of the second thermoelectric member 125 are substantially greater than about 0.2 µm. In some embodiments, the first thickness T1 and the second thickness T2 are between about 0.2 µm and about 50 µm. When the thickness T1, T2 is higher than 50 µm, the cost of the semiconductor structure 100 is too high; when the thickness T1, T2 is less than 0.2 µm, the resistance of the first thermoelectric member 124 and the second thermoelectric member 125 is too high. In some embodiments, the first thickness T1 and the second thickness T2 are between about 0.2 µm and about 2 µm. In some embodiments, a first thickness T1 of the first thermoelectric member 124 and a second thickness T2 of the second thermoelectric member 125 are substantially orthogonal to the third surface 101a of the first dielectric layer 101. In some embodiments, a length L of the first thermoelectric member 124 or the length L of the second thermoelectric member 125 is substantially greater than the first thickness T1 and the second thickness T2. In some embodiments, the first thickness T1 is substantially equal to the second thickness T2.

In some embodiments, the first thermoelectric member 124 and the second thermoelectric member 125 are disposed between the first conductive member 122 and the second conductive member 123 in a top view. In some embodiments, a portion of the first thermoelectric member 124 and a portion of the second thermoelectric member 125 overlap the first conductive member 122 and the second conductive member 123 in a top view. In some embodiments, the first thermoelectric member 124 and the second thermoelectric member 125 are adjacent to each other. In some embodiments, the first conductive member 122 and the second conductive member 123 extend between the first thermoelectric member 124 and the second thermoelectric member 125. In some embodiments, the first thermoelectric member 124 and the second thermoelectric member 125 are exposed by the third surface 101a of the first dielectric layer 101.

In some embodiments, the first thermoelectric member 124 includes a diffusion barrier layer at each end of the first thermoelectric member 124. In some embodiments, the second thermoelectric member 125 also includes the diffusion barrier layer at each end of the second thermoelectric member 125. In some embodiments, the diffusion barrier layer includes titanium, gold, copper or the like. In some embodiments, the diffusion barrier layer is disposed between the first thermoelectric member 124 and the first conductive member 122, or between the first thermoelectric member 124 and second conductive member 123. In some embodiments, the diffusion barrier layer is disposed between the second thermoelectric member 125 and the first conductive member 122, or between the second thermoelectric member 125 and second conductive member 123.

In some embodiments, the first thermoelectric member 124 is separated from the second thermoelectric member 125 by a second distance D2. In some embodiments, the second distance D2 between the first thermoelectric member 124 and the second thermoelectric member 125 is substantially between about 0.04 µm and about 10 µm. When the distance D2 is higher than 10 µm, the size of the semiconductor structure 100 has to expand; when the distance D2 is less than 0.04 µm, there is a challenge to form reliable semiconductor devices. In some embodiments, the second distance D2 is between about 0.04 µm and about 1 µm. In some embodiments, the second distance D2 is less than the length L of the first thermoelectric member 124 or the length L of the second thermoelectric member 125.

In some embodiments, a third thickness T3 of the first thermoelectric member 124 and a fourth thickness T4 of the second thermoelectric member 125 are substantially orthogonal to the third surface 101a of the first dielectric layer 101. In some embodiments, the length L is substantially greater than the third thickness T3 and the fourth thickness T4. In some embodiments, the first thickness T1 and the second thickness T2 are substantially greater than the third thickness T3 or the fourth thickness T4. In some embodiments, the third thickness T3 is substantially equal to the fourth thickness T4. In some embodiments, the first thickness T1 is substantially greater than the third thickness T3 and the fourth thickness T4. In some embodiments, the second thickness T2 is substantially greater than the third thickness T3 and the fourth thickness T4. In some embodiments, a width W3 of the first conductive member 122 or the second conductive member 123 is substantially equal to the width W1 of the first thermoelectric member 124 or the width W2 of the second thermoelectric member 125.

In some embodiments, the conductive structure 121 further includes a second via 126a and a third via 126b electrically connected to the first thermoelectric member 124 and the second thermoelectric member 125, respectively. In some embodiments, the second dielectric layer 102 surrounds the second via 126a and the third via 126b. In some embodiments, the second via 126a is disposed between the first conductive member 122 and the first thermoelectric member 124, or between the second conductive member 123 and the first thermoelectric member 124. In some embodiments, the third via 126b is disposed between the first conductive member 122 and the second thermoelectric member 125, or between the second conductive member 123 and the second thermoelectric member 125. In some embodiments, the conductive structure 121 includes a plurality of second vias 126a and a plurality of third vias 126b. In some embodiments, the diffusion barrier layer is disposed between the first thermoelectric member 124 and the second via 126a. In some embodiments, the diffusion barrier layer is disposed between the second thermoelectric member 125 and the third via 126b. In some embodiments, the second via 126a and the third via 126b are omitted, and the first conductive member 122 and the second conductive member 123 are attached to the first thermoelectric member 124 and the second thermoelectric member 125. As such, the thermal control mechanism 120 is configured to have a minimized thickness.

In some embodiments, the thermal control mechanism 120 is operated by application of a voltage. In some embodiments, the voltage is applied through the conductive structure 121. When the voltage is applied to the thermal control mechanism 120, there is a temperature difference between the first conductive member 122 and the second conductive member 123. As such, heat is able to be transferred and dissipated from the first conductive member 122 and the second conductive member 123 through the first thermoelectric member 124 and the second thermoelectric member 125. For example, heat generated from the optical component 111 or heat around the optical component 111 is able to be dissipated by the thermal control mechanism 120. In some embodiments, the heat is directed from the first conductive member 122 toward the second conductive member 123. As a result, the heat is able to be dissipated toward the periphery of the semiconductor structure 100 or to the environment surrounding the thermal control mechanism 120. In some embodiments, the optical component 111 is heat sensitive, and therefore the thermal control mechanism 120 is able to direct heat away from the optical component 111 in order to prevent the optical component 111 from damage by heat.

In some embodiments, a heat spreader 140 is thermally and/or electrically connected to the first via 130 and configured to spread the heat dissipated from or around the optical component 111. In some embodiments, the heat spreader 140 is disposed under the first dielectric layer 101. In some embodiments, the first thermoelectric member 124 and the second thermoelectric member 125 are electrically connected to the heat spreader 140 through the first via 130 and the conductive structure 121. In some embodiments, the heat spreader 140 is disposed over a fourth surface 101b of the first dielectric layer 101. In some embodiments, the heat spreader 140 overlaps the thermal control mechanism 120 and the optical component 111 in a top view. In some embodiments, the heat spreader 140 includes conductive material such as gold, silver, copper, nickel, tungsten, aluminum, tin and/or alloys thereof.

In some embodiments, the semiconductor structure 100 further includes a fourth via 150 configured to transmit a signal. In some embodiments, the fourth via 150 extends through the first dielectric layer 101. In some embodiments, the fourth via 150 is disposed within the first dielectric layer 101. In some embodiments, an end of the fourth via 150 is at least partially exposed by the first dielectric layer 101. In some embodiments, the fourth via 150 protrudes from the first dielectric layer 101. In some embodiments, the second dielectric layer 102 surrounds a portion of the fourth via 150 protruding from the first dielectric layer 101. In some embodiments, the fourth via 150 is electrically isolated from the heat spreader 140. In some embodiments, the fourth via 150 is disposed adjacent to the first via 130. In some embodiments, the fourth via 150 is disposed adjacent to the thermal control mechanism 120. In some embodiments, the first via 130 is disposed between the fourth via 150 and the thermal control mechanism 120. In some embodiments, the length of the first via 130 is substantially equal to the length of the fourth via 150. In some embodiments, the fourth via 150 is a through dielectric via (TDV).

In some embodiments, a first interconnect structure 103 surrounded by the second dielectric layer 102 is electrically connected to the thermal control mechanism 120 and the first via 130. In some embodiments, the first interconnect structure 103 surrounded by the second dielectric layer 102 is electrically connected to the fourth via 150. In some embodiments, the first interconnect structure 103 includes a plurality of conductive patterns distributed in and surrounded by the second dielectric layer 102. In some embodiments, the plurality of conductive patterns includes via portions 103a and pad portions 103b. In some embodiments, the fourth via 150 is electrically connected to one of the pad portions 103b of the first interconnect structure 103. In some embodiments, the thermal control mechanism 120 is electrically connected to at least one of the via portions 103a and at least one of the pad portions 103b. In some embodiments, the first conductive member 122 and the second conductive member 123 are substantially level with at least one of the pad portions 103b. In some embodiments, the first interconnect structure 103 includes a conductive material such as gold, silver, copper, nickel, tungsten, aluminum, tin and/or alloys thereof.

In some embodiments, a passivation layer 104 is disposed over the second dielectric layer 102 and the first interconnect structure 103. In some embodiments, the passivation layer 104 is configured to provide a trench above the first interconnect structure 103, wherein the trench defines exposed portions of the first interconnect structure 103. In some embodiments, some of the pad portions 103b of the first interconnect structure 103 are exposed by the passivation layer 104. In some embodiments, the passivation layer 104 includes dielectric materials such as polyimide (PI), benzocyclobutene (BCB), polybenzoxazole (PBO), silicon nitride (SiN), silicon carbide (SiC), silicon oxide (SiO), silicon oxynitride (SiON), low-k dielectrics such as carbon-doped oxides, extremely low-k dielectrics such as porous carbon-doped silicon dioxide, or combinations thereof.

Figure 3:
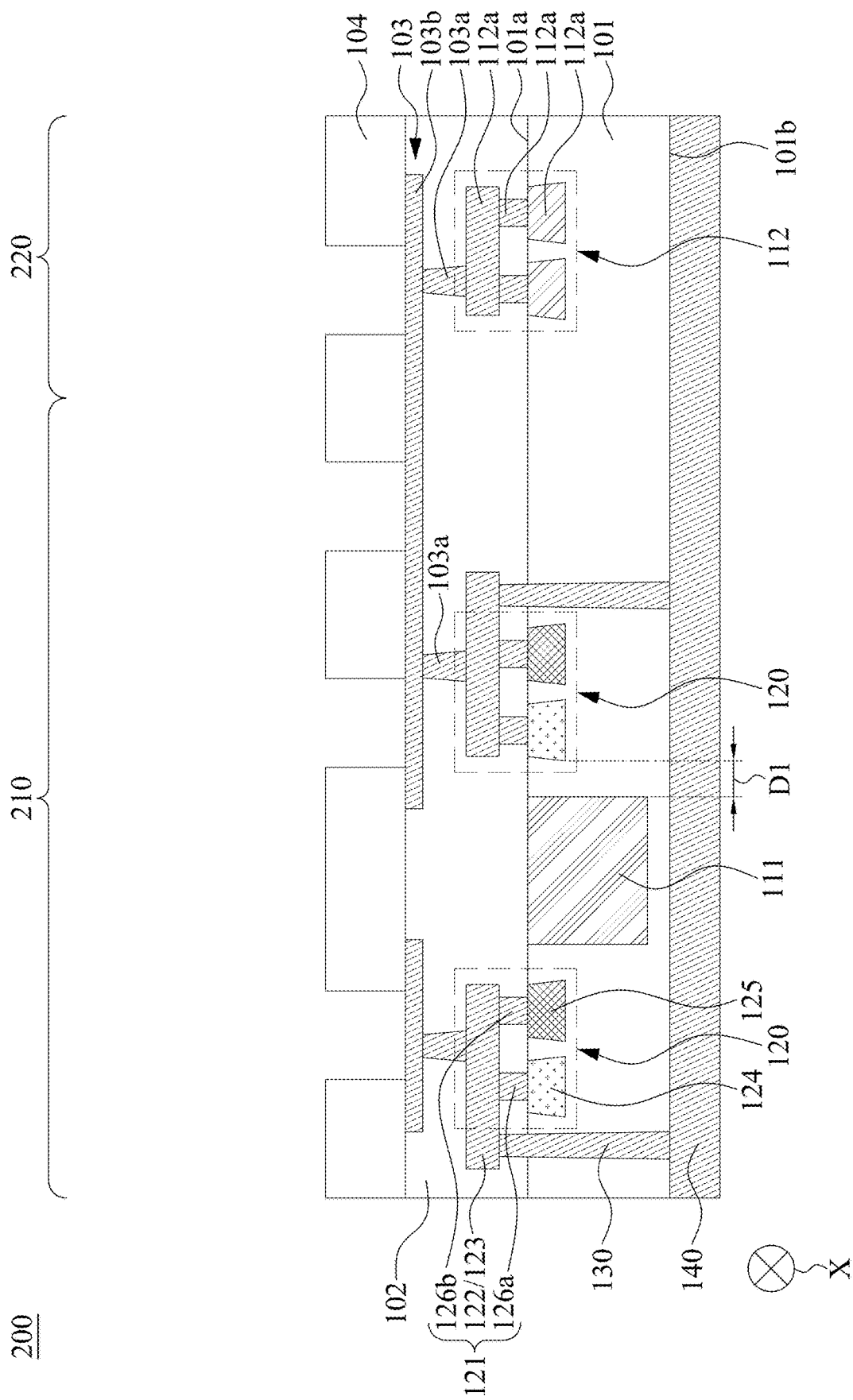
FIG. 3 is a cross-sectional view of a semiconductor structure in accordance with some embodiments of the present disclosure.

FIG. 3 is a cross-sectional view of a semiconductor structure 200 in accordance with some embodiments of the present disclosure. In some embodiments, the semiconductor structure 200 is similar to the semiconductor structure 100 and further includes an electrical component 112. In some embodiments, the electrical component 112 is disposed adjacent to the optical component 111. In some embodiments, the electrical component 112 is electrically connected to the optical component 111. In some embodiments, the thermal control mechanism 120 is disposed between the optical component 111 and the electrical component 112. In some embodiments, the electrical component 112 is electrically connected to the thermal control mechanism 120. In some embodiments, the electrical component 112 is electrically connected to the thermal control mechanism 120 through the first interconnect structure 103. In some embodiments, the electrical component 112 is disposed adjacent to the thermal control mechanism 120. In some embodiments, the electrical component 112 is surrounded by the first dielectric layer 101 and/or the second dielectric layer 102.

In some embodiments, the thermal control mechanism 120 is disposed between the optical component 111 and the electrical component 112. In some embodiments, the electrical component 112 is laterally offset from the thermal control mechanism 120 and the optical component 111 in a top view. In some embodiments, the optical component 111 and the electrical component 112 are electrically connected.

In some embodiments, the electrical component 112 is configured to transit an electric signal. In some embodiments, the electrical component 112 is a die, such as a logic device die, central computing unit (CPU) die, a system on chip (SoC) or the like. In some embodiments, the electrical component 112 includes a plurality of conductive members 112a such as pads or vias. In some embodiments, the conductive members 112a form a circuitry within the electrical component 112. In some embodiments, the conductive members 112a include gold, silver, copper, nickel, tungsten, aluminum, palladium and/or alloys thereof.

In some embodiments, the semiconductor structure 200 includes an optical portion 210 and an electrical portion 220 adjacent to the optical portion 210. In some embodiments, the optical portion 210 is laterally offset from the electrical portion 220 in a top view. Since the optical component 111 is more thermally sensitive than the electrical component 112, in some embodiments, the optical portion 210 includes the optical component 111 and the thermal control mechanism 120, and the electrical portion 220 includes the electrical component 112. In some embodiments, the heat spreader 140 is disposed in the optical portion 210. In some embodiments, the heat spreader 140 is disposed in the optical portion 210 and the electrical portion 220. In some embodiments, the optical component 111, the electrical component 112 and the thermal control mechanism 120 are disposed on the heat spreader 140.

Figure 4:
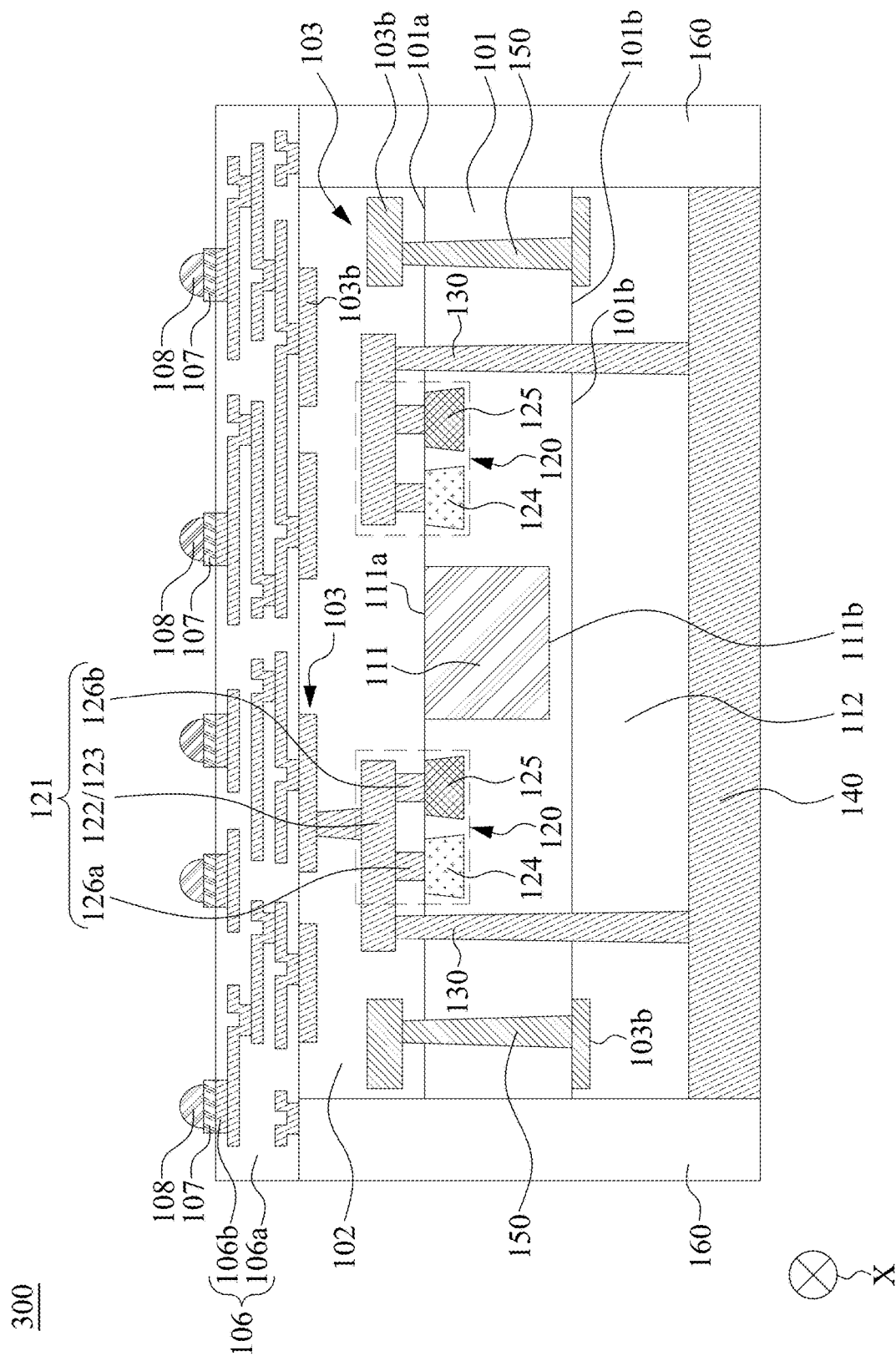
FIG. 4 is a cross-sectional view of a semiconductor structure in accordance with some embodiments of the present disclosure.

FIG. 4 is a cross-sectional view of a semiconductor structure 300 in accordance with some embodiments of the present disclosure. In some embodiments, the semiconductor structure 300 is similar to the semiconductor structure 100 and further includes the electrical component 112 disposed under the optical component 111 and a molding 160 surrounding the thermal control mechanism 120, the optical component 111 and the electrical component 112. In some embodiments, the semiconductor structure 300 further includes an RDL 106 disposed on the second dielectric layer 102, and a bump pad 107 and a first conductive bump 108 disposed on the RDL 106.

In some embodiments, the electrical component 112 is disposed between the heat spreader 140 and the optical component 111. In some embodiments, the thermal control mechanism 120 surrounds the optical component 111 and the electrical component 112 in a top view. In some embodiments, the thermal control mechanism 120 and the electrical component 112 overlap in a top view.

In some embodiments, the electrical component 112 is disposed over the fourth surface 101b of the first dielectric layer 101. In some embodiments, the electrical component 112 is disposed under the first dielectric layer 101. In some embodiments, the electrical component 112 is in contact with the fourth surface 101b of the first dielectric layer 101. In some embodiments, the heat spreader 140 is disposed under the electrical component 112. In some embodiments, the first via 130 extends through the electrical component 112. In some embodiments, the first via 130 extends through the first dielectric layer 101 and the electrical component 112. In some embodiments, the fourth via 150 is electrically connected to the pad portions 103b disposed in the second dielectric layer 102 and the electrical component 112. In some embodiments, the electrical component 112 includes a substrate.

In some embodiments, the semiconductor structure 300 includes a redistribution layer (RDL) 106 disposed on the second dielectric layer 102 and the first interconnect structure 103. In some embodiments, the RDL 106 includes a fourth dielectric layer 106a and a second interconnect structure 106b surrounded by the fourth dielectric layer 106a. In some embodiments, the RDL 106 is a front side RDL.

In some embodiments, the fourth dielectric layer 106a is a single dielectric layer. In some embodiments, the fourth dielectric layer 106a is comprised of multiple dielectric layers. In some embodiments, the fourth dielectric layer 106a includes dielectric material such as silicon oxide, silicon nitride, undoped silicon glass or the like. In some embodiments, the fourth dielectric layer 106a includes polymeric material such as polyimide (PI), polybenzoxazole (PBO) or the like. In some embodiments, the fourth dielectric layer 106a includes several dielectric layers with dielectric materials different from or same as each other.

In some embodiments, the second interconnect structure 106b is surrounded by the fourth dielectric layer 106a. In some embodiments, the second interconnect structure 106b extends within the fourth dielectric layer 106a. In some embodiments, the second interconnect structure 106b extends through one or more layers of the fourth dielectric layer 106a. In some embodiments, the second interconnect structure 106b is electrically connected to the first interconnect structure 103, the first via 130 and the thermal control mechanism 120. In some embodiments, the second interconnect structure 106b is directly coupled with the first interconnect structure 103. In some embodiments, the second interconnect structure 106b is electrically connected to the electrical component 112. In some embodiments, the second interconnect structure 106b is electrically connected to the fourth via 150. In some embodiments, the second interconnect structure 106b includes conductive material such as gold, silver, copper, nickel, tungsten, aluminum, tin and/or alloys thereof.

In some embodiments, a bump pad 107 is disposed on the RDL 106. In some embodiments, the bump pad 107 is disposed on the fourth dielectric layer 106a and electrically connected to the second interconnect structure 106b. In some embodiments, the bump pad 107 is configured to receive a conductive member or the like. In some embodiments, the bump pad 107 includes an under bump metallization (UBM) pad. In some embodiments, the bump pad 107 is electrically connected to the thermal control mechanism 120 through the first interconnect structure 103 and the second interconnect structure 106b. In some embodiments, the bump pad 107 is electrically connected to the optical component 111. In some embodiments, the bump pad 107 is electrically connected to the electrical component 112. In some embodiments, the bump pad 107 is electrically connected to the first via 130 and the heat spreader 140 through the first interconnect structure 103 and the second interconnect structure 106b. In some embodiments, the bump pad 107 includes gold, silver, copper, nickel, tungsten, aluminum, palladium and/or alloys thereof. In some embodiments, the bump pad 107 is omitted.

In some embodiments, the first conductive bump 108 is disposed on the RDL 106 and electrically connected to the first interconnect structure 103 and the second interconnect structure 106b. In some embodiments, the first conductive bump 108 is disposed on the bump pad 107. In some embodiments, the first conductive bump 108 includes conductive material such as solder, copper, nickel, gold or the like. In some embodiments, the first conductive bump 108 is a solder ball, a ball grid array (BGA) ball, a controlled collapse chip connection (C4) bump, a pillar or the like. In some embodiments, the first conductive bump 108 is in a spherical, hemispherical or cylindrical shape.

In some embodiments, the semiconductor structure 300 is a semiconductor package. In some embodiments, the semiconductor structure 300 is a part of a semiconductor package. In some embodiments, the semiconductor structure 300 is an integrated fan out (InFO) package, wherein I/O terminals of the electrical component 112 are fanned out and redistributed over a greater area. In some embodiments, the semiconductor structure 300 is a three-dimensional integrated circuit (3D IC). In some embodiments, the semiconductor structure 300 is a chip on wafer on substrate (CoWoS) structure.

In some embodiments, the molding 160 surrounds the first dielectric layer 101, the second dielectric layer 102 and the electrical component 112. In some embodiments, the molding 160 is in contact with sidewalls of the first dielectric layer 101, the second dielectric layer 102 and the electrical component 112. In some embodiments, the molding 160 is in contact with sidewalls of the heat spreader 140 and exposes at least a portion of the heat spreader 140. In some embodiments, the molding 160 includes a single-layer film or a composite stack. In some embodiments, the RDL 106 is disposed on the molding 160.

In some embodiments, the molding 160 has a high thermal conductivity, a low moisture absorption rate and a high flexural strength. In some embodiments, the molding 160 includes various materials, such as molding compound, molding underfill, epoxy, resin, or the like.

Figure 5:
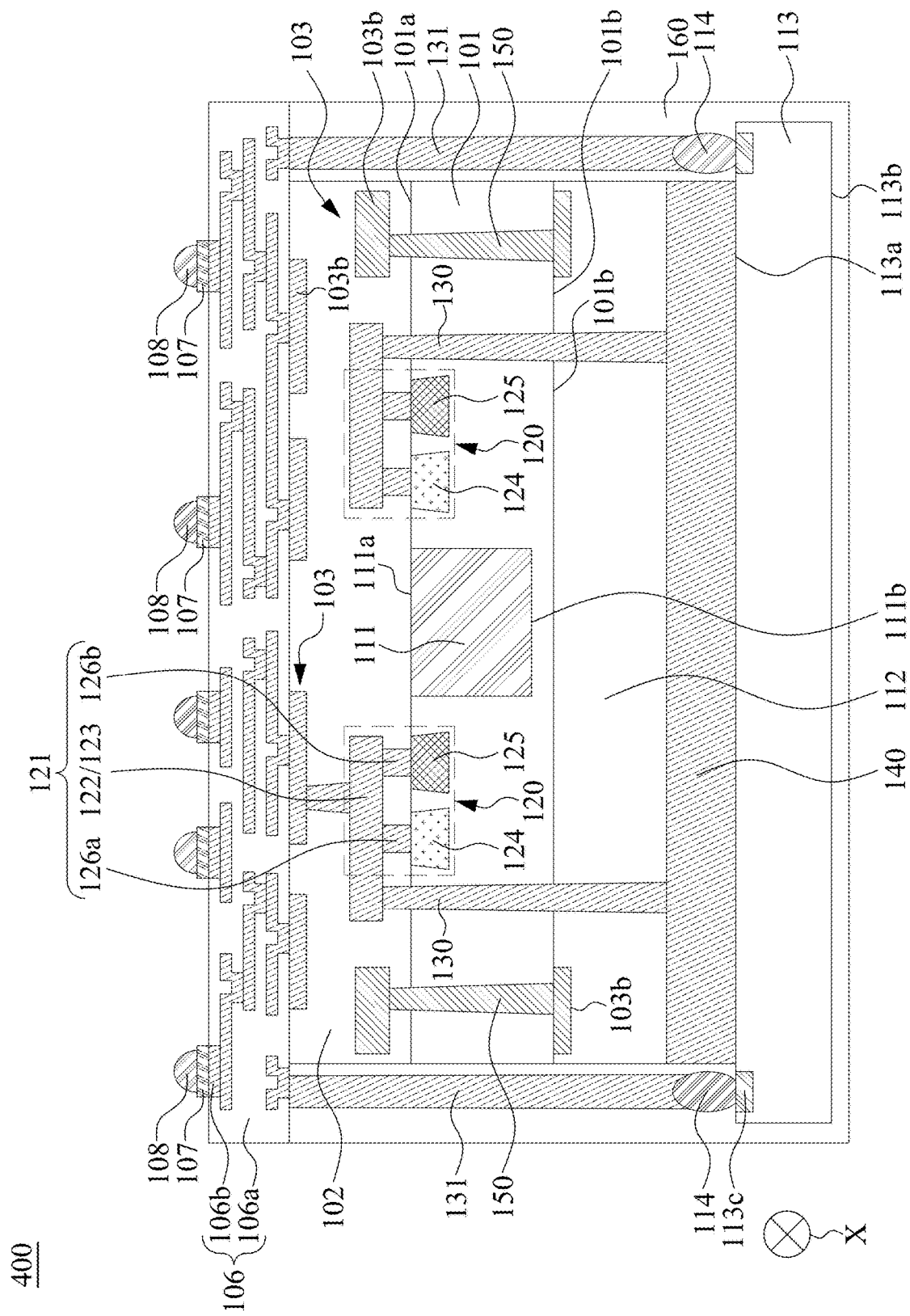
FIG. 5 is a cross-sectional view of a semiconductor structure in accordance with some embodiments of the present disclosure.

FIG. 5 is a cross-sectional view of a semiconductor structure 400 in accordance with some embodiments of the present disclosure. In some embodiments, the semiconductor structure 400 is similar to the semiconductor structure 300 and further includes a die 113 disposed under the heat spreader 140 and a second conductive bump 114 electrically connected to the die 113. In some embodiments, the die 113 is disposed under the heat spreader 140 and electrically connected to the second interconnect structure 106b of the RDL 106. In some embodiments, the die 113 is disposed under the electrical component 112. In some embodiments, the molding 160 surrounds the die 113. In some embodiments, a portion of the die 113 is exposed by the molding 160.

In some embodiments, the die 113 is fabricated with a predetermined functional circuit within the die 113, wherein the predetermined functional circuit is produced by photolithography operations. In some embodiments, the die 113 is a memory die, a dynamic random-access memory (DRAM) die, a high bandwidth memory (HBM) die or the like. In some embodiments, the die 113 is a chip or a package. In some embodiments, the die 113 is electrically connected to the electrical component 112.

In some embodiments, the die 113 includes a fifth surface 113a and a sixth surface 113b opposite to the fifth surface 113a. In some embodiments, the fifth surface 113a is a front or active side of the die 113. In some embodiments, the sixth surface 113b is a back or inactive side of the die 113. In some embodiments, the fifth surface 113a is directly coupled to the heat spreader 140. In some embodiments, the sixth surface 113b is exposed by the molding 160.

In some embodiments, the die 113 includes several second pads 113c disposed over or within the die 113. In some embodiments, the second pad 113c is electrically connected to the second interconnect structure 106b of the RDL 106 through a fifth via 131. In some embodiments, the fifth via 131 is disposed between the RDL 106 and the die 113. In some embodiments, the molding 160 surrounds the fifth via 131. In some embodiments, the second pad 113c is electrically connected to the thermal control mechanism 120 and the first via 130 through the second conductive bump 114, the fifth via 131 and the second interconnect structure 106b. In some embodiments, the second pad 113c is electrically connected to the fourth via 150.

In some embodiments, the second pad 113c is disposed over the fifth surface 113a of the die 113. In some embodiments, the second pad 113c is electrically connected to a circuitry over or within the die 113. In some embodiments, the second pad 113c is configured to electrically connect to a circuitry external to the die 113. In some embodiments, the second pad 113c is configured to electrically connect to a conductive trace or a conductive structure. In some embodiments, the second pad 113c includes gold, silver, copper, nickel, tungsten, aluminum, palladium and/or alloys thereof. FIG. 5 illustrates only two second pads 113c over the die 113 for clarity and simplicity, however, a person ordinarily skilled in the art would readily understand that one or more second pads 113c is present over the die 113 in some embodiments.

Figure 6:
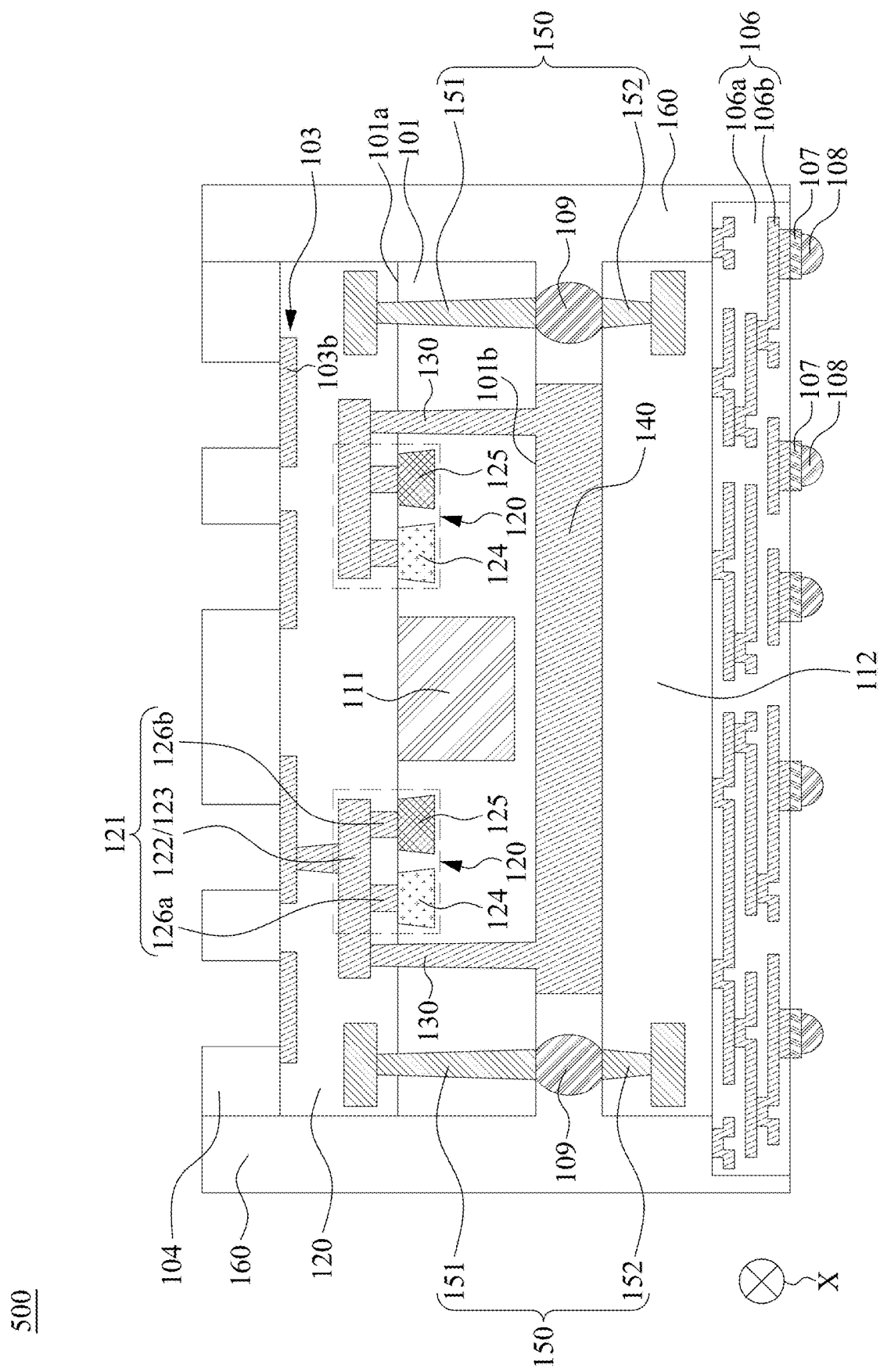
FIG. 6 is a cross-sectional view of a semiconductor structure in accordance with some embodiments of the present disclosure.

FIG. 6 is a cross-sectional view of a semiconductor structure 500 in accordance with some embodiments of the present disclosure. In some embodiments, the semiconductor structure 500 is similar to the semiconductor structure 100 and further includes the electrical component 112 disposed under the heat spreader 140, and the molding 160 surrounding the first and second dielectric layers 101, 102, the electrical component 112, and the heat spreader 140. In some embodiments, the semiconductor structure 500 further includes the RDL 106 disposed under the electrical component 112, wherein the bump pad 107 and the first conductive bump 108 are disposed under the RDL 106. In some embodiments, the RDL 106 is electrically connected to the electrical component 112.

In some embodiments, the heat spreader 140 is disposed between the optical component 111 and the electrical component 112. In some embodiments, the heat spreader 140 is electrically isolated from the electrical component 112. In some embodiments, the second interconnect structure 106b is electrically connected to the first interconnect structure 103.

In some embodiments, the fourth via 150 includes a first portion 151 disposed in the first and second dielectric layers 101, 102 and a second portion 152 disposed in the electrical component 112. In some embodiments, a third conductive bump 109 is disposed between and electrically connected to the first portion 151 and the second portion 152. In some embodiments, the third conductive bump 109 includes conductive material such as solder, copper, nickel, gold or the like. In some embodiments, the first conductive bump 108 is a solder ball, a ball grid array (BGA) ball, a controlled collapse chip connection (C4) bump, a pillar or the like. In some embodiments, the third conductive bump 109 is in a spherical, hemispherical or cylindrical shape.

Figure 7:
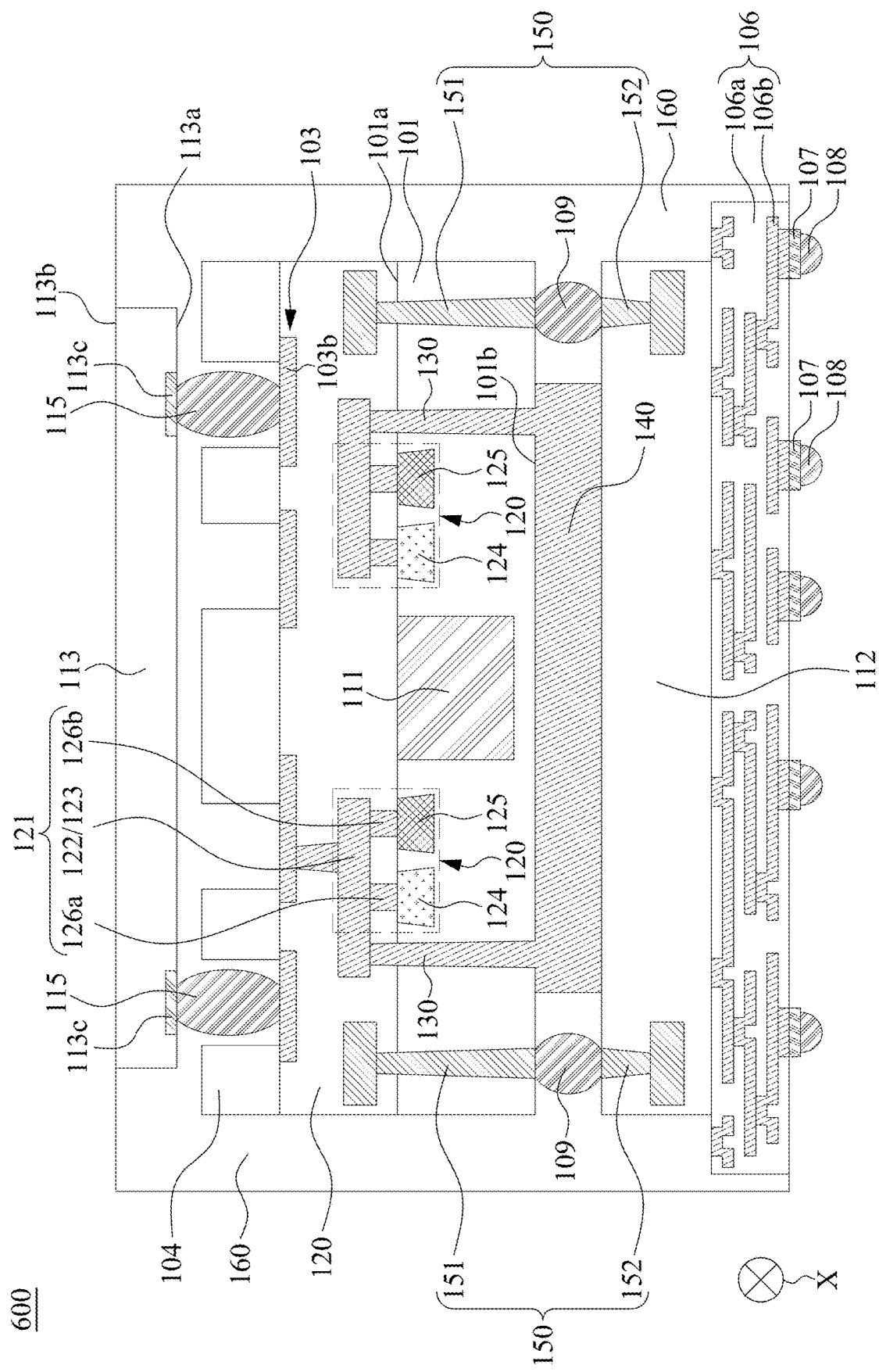
FIG. 7 is a cross-sectional view of a semiconductor structure in accordance with some embodiments of the present disclosure.

FIG. 7 is a cross-sectional view of a semiconductor structure 600 in accordance with some embodiments of the present disclosure. In some embodiments, the semiconductor structure 600 is similar to the semiconductor structure 500 and further includes the die 113 disposed over the passivation layer 104 and a fourth conductive bump 115 electrically connecting the die 113 to the first interconnect structure 103. In some embodiments, the die 113 is disposed over the second dielectric layer 102. In some embodiments, at least a portion of the thermal control mechanism 120 is disposed between the die 113 and the electrical component 112.

In some embodiments, the fourth conductive bump 115 is surrounded by the molding 160. In some embodiments, the molding 160 is disposed between the passivation layer 104 and the die 113. In some embodiments, the fourth conductive bump 115 is disposed between the first interconnect structure 103 and the die 113. In some embodiments, the fourth conductive bump 115 includes conductive material such as solder, copper, nickel, gold or the like. In some embodiments, the fourth conductive bump 115 is a solder ball, a ball grid array (BGA) ball, a controlled collapse chip connection (C4) bump, a pillar or the like. In some embodiments, the fourth conductive bump 115 is in a spherical, hemispherical or cylindrical shape.

Figure 8:
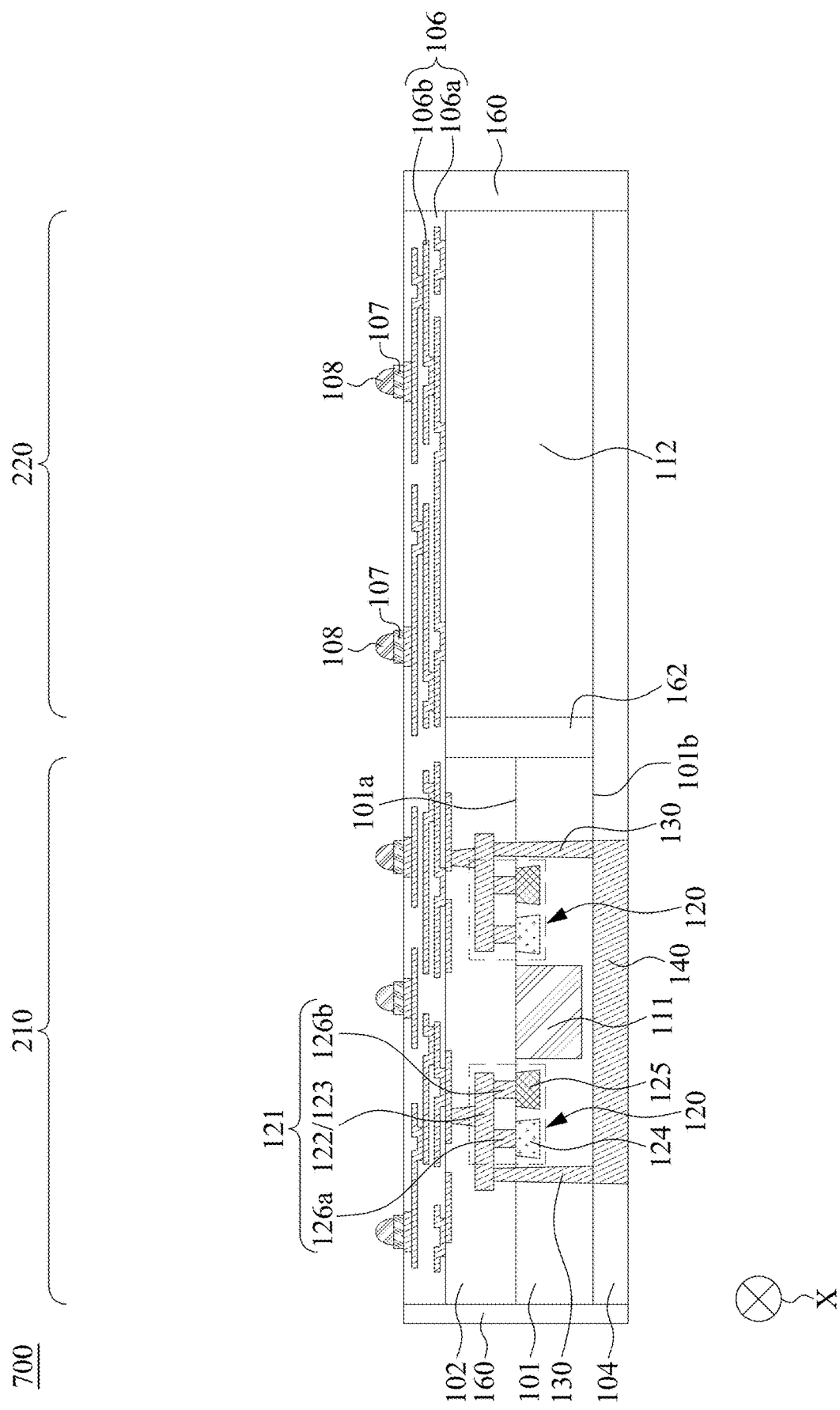
FIG. 8 is a cross-sectional view of a semiconductor structure in accordance with some embodiments of the present disclosure.

FIG. 8 is a cross-sectional view of a semiconductor structure 700 in accordance with some embodiments of the present disclosure. In some embodiments, the semiconductor structure 700 is similar to the semiconductor structure 100 and further includes the electrical component 112 adjacent to the thermal control mechanism 120. In some embodiments, the electrical component 112 is disposed adjacent to a stack of the first dielectric layer 101 and the second dielectric layer 102. In some embodiments, a thickness of the electrical component 112 is substantially equal to a total thickness of the first dielectric layer 101 and the second dielectric layer 102. In some embodiments, the electrical component 112 electrically connects to the second interconnect structure 106b.

In some embodiments, the heat spreader 140 is disposed under the first via 130, the thermal control mechanism 120 and the optical component 111. In some embodiments, the passivation layer 104 is disposed adjacent to the heat spreader 140, and the heat spreader 140 is exposed by the passivation layer 104. In some embodiments, the passivation layer 104 is disposed under the electrical component 112.

In some embodiments, the molding 160 surrounds the optical portion 210 and the electrical portion 220. In some embodiments, a portion 162 of the molding 160 is disposed between the optical portion 210 and the electrical portion 220. In some embodiments, the portion 162 of the molding 160 separates the optical portion 210 from the electrical portion 220. In some embodiments, the portion 162 of the molding 160 is disposed between the electrical component 112 and the stack of the first and second dielectric layers 101, 102. In some embodiments, the portion 162 of the molding 160 is disposed between the RDL 103 and the passivation layer 104.

In some embodiments, the RDL 106 is disposed on the second dielectric layer 102 and the electrical component 112. In some embodiments, the passivation layer 104 is disposed under the first dielectric layer 101 and the electrical component 112. In some embodiments, the molding surrounds the RDL 106 and the passivation layer 104.

Figure 9:
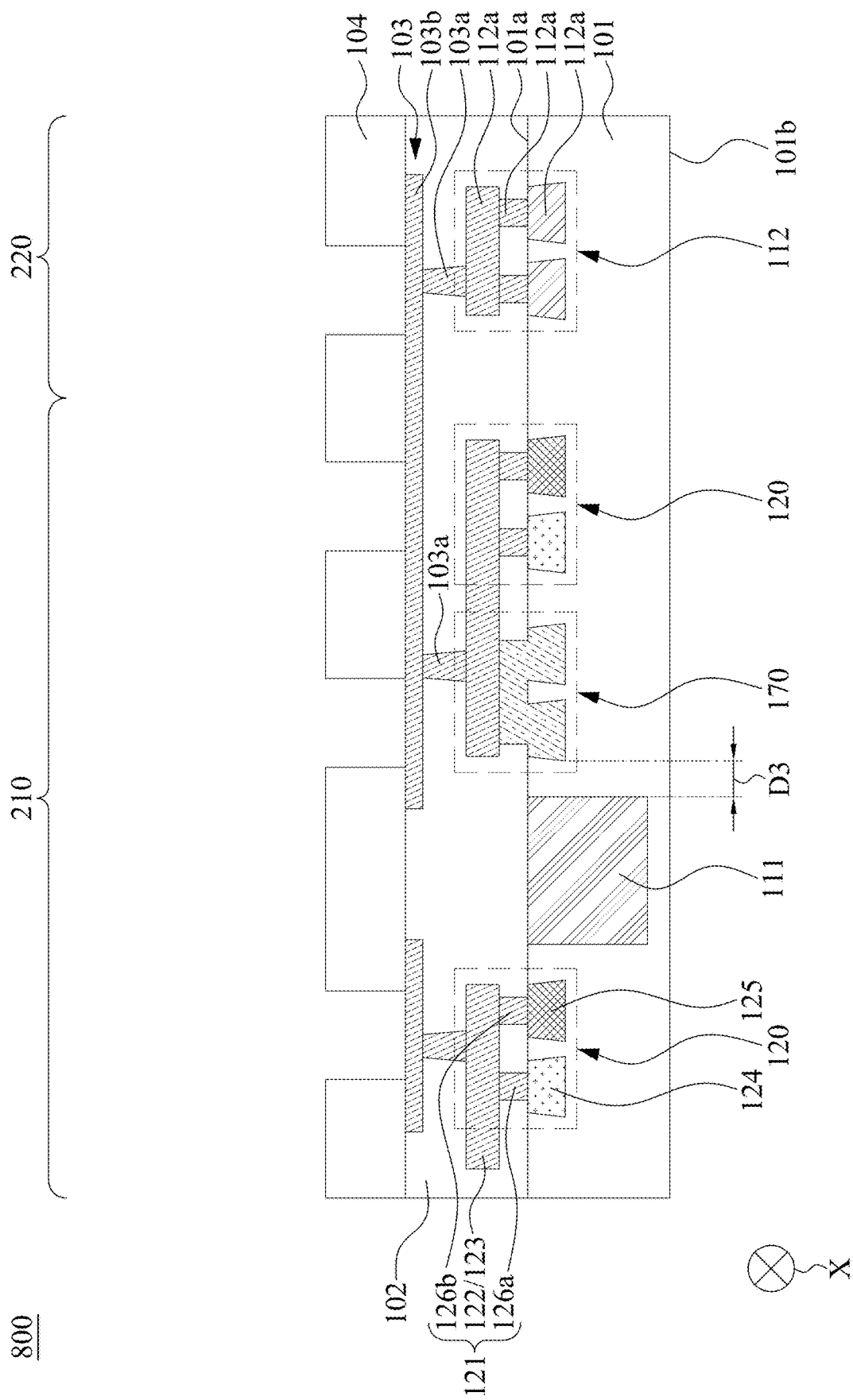
FIG. 9 is a cross-sectional view of a semiconductor structure in accordance with some embodiments of the present disclosure.

FIG. 9 is a cross-sectional view of a semiconductor structure 800 in accordance with some embodiments of the present disclosure. In some embodiments, referring to FIG. 9, the semiconductor structure 800 includes an optical component 111, an electrical component 112 adjacent to the optical component 111, a thermal control mechanism 120 between the optical component 111 and the electrical component 112, a first dielectric layer 101, and a thermal sensing circuit 170. The thermal sensing circuit 170 is disposed between the thermal control mechanism 120 and the optical component 111 and is configured to control a current direction of a current flowing through the thermal control mechanism 120. In some embodiments, a first via 130 and a heat spreader 140 are omitted.

In some embodiments, the thermal control mechanism 120, the thermal sensing circuit 170 and the optical component 111 are disposed in an optical portion 210. The thermal sensing circuit 170 is electrically connected to the thermal control mechanism 120 and is closer to the optical component 111 than the electrical component 112. In some embodiments, a third distance D3 between the thermal sensing circuit 170 and the optical component 111 is between about 0.01 μm and about 1.0 μm for optimal thermal sensing. When the distance D3 is less than 0.01 μm, the cost of the semiconductor structure 100 is too high; when the distance D3 is greater than 1.0 μm, the thermal sensing circuit 170 cannot accurately sense the condition of the optical component 111. In some embodiments, the third distance D3 is between about 0.02 μm and about 0.5 μm. The thermal sensing circuit 170 includes a bandgap temperature sensor in some embodiments.

In some embodiments, the first dielectric layer 101 surrounds at least a portion of the thermal sensing circuit 170. In some embodiments, a second dielectric layer 102 surrounds at least a portion of the thermal sensing circuit 170. In some embodiments, the thermal control mechanism 120 surrounds the thermal sensing circuit 170 and the optical component 111 in a top view.

In some embodiments, the thermal sensing circuit 170 is electrically connected to the thermal control mechanism 120 through a conductive structure 121. In some embodiments, the thermal sensing circuit 170 is electrically connected to the thermal control mechanism 120 through a first conductive member 122 and a second conductive member 123. In some embodiments, the thermal sensing circuit 170 is electrically connected to the electrical component 112 through a first interconnect structure 103.

Figure 10A:
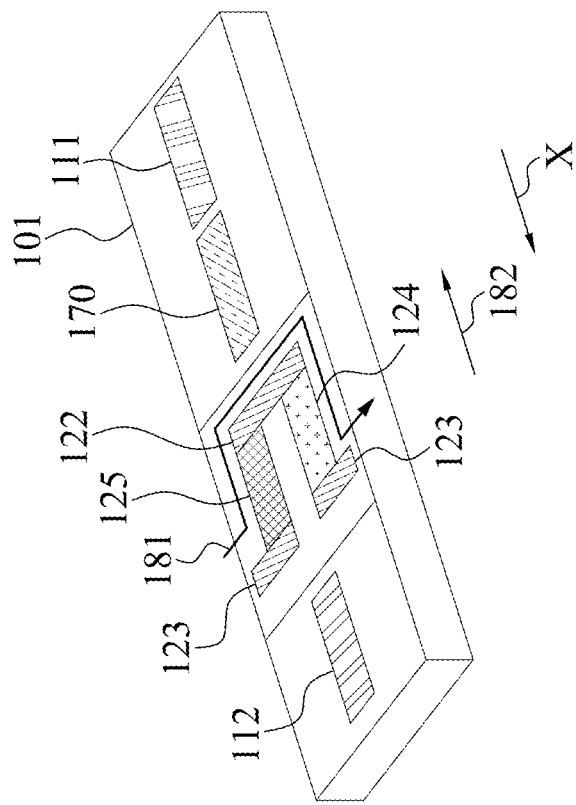
FIGS. 10A and 10B are enlarged perspective views of a portion of the semiconductor structure in FIG. 9.
Figure 10B:
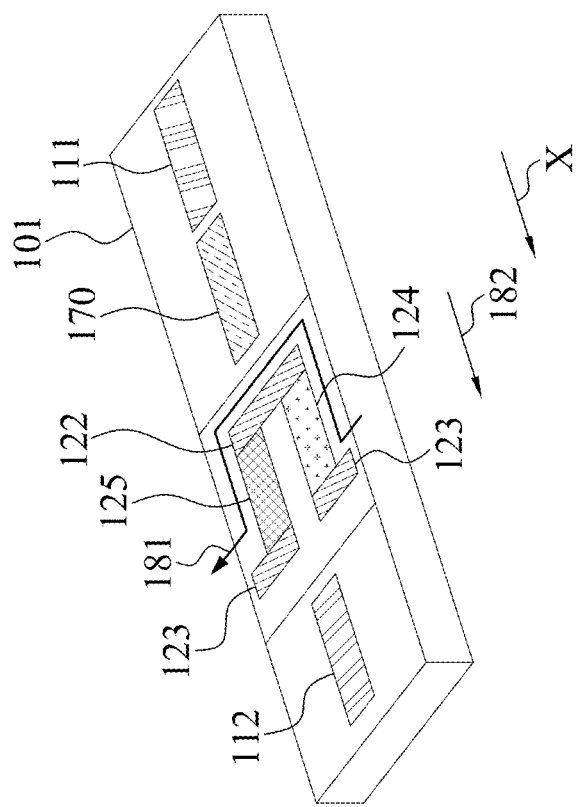

FIGS. 10A and 10B are enlarged perspective views of a portion of the semiconductor structure 800 in FIG. 9. The thermal sensing circuit 170 controls the current direction of the current flowing through the thermal control mechanism 120, and causes the thermal control mechanism 120 to transfer heat from the optical component 111 to the electrical component 112 to cool down the optical component 111. As such, the thermal control mechanism 120 is capable of adjusting the temperatures of both the optical component 111 and the electrical component 112. In some embodiments, by controlling the current direction, the optical component 111 is cooled. In some embodiments, the thermal control mechanism 120 is capable of transferring heat from the electrical component 112 to the optical component 111, while maintaining the temperature of the optical component 111 or the temperature around the optical component 111 is lower than a predetermined threshold temperature and ensuring no adverse effect on performance or functions of the optical component 111. As such, the thermal control mechanism 120 is capable of adjusting the temperatures of both the optical component 111 and the electrical component 112. In some embodiments, by controlling the current direction, the electrical component 112 is able to dissipate heat while the temperature of the optical component 111 is under control.

In some embodiments, referring to FIG. 10A, a current 181 flows through the thermal control mechanism 120, and heat 182 is transferred from the optical component 111 to the electrical component 112. In some embodiments, the current 181 flows from the second conductive member 123 to a first thermoelectric member 124 and from the first conductive member 122 to a second thermoelectric member 125, and the heat dissipates from the optical component 111 to the electrical component 112. In some embodiments, the thermal control mechanism 120 surrounds the thermal sensing circuit 170 and the optical component 111, the current flows counter-clockwise and the heat dissipates from the optical component 111 to the electrical component 112.

In some embodiments, referring to FIG. 10B, the current 181 flows through the thermal control mechanism 120, and heat 182 is transferred from the electrical component 112 to the optical component 111. In some embodiments, the current 181 flows from the second conductive member 123 to the second thermoelectric member 125 and from the first conductive member 122 to the first thermoelectric member 124, and the heat dissipates from the electrical component 112. In some embodiments, the thermal control mechanism 120 surrounds the thermal sensing circuit 170 and the optical component 111, the current flows clockwise and the heat dissipates from the electrical component 112 to the optical component 111.

Figure 11:
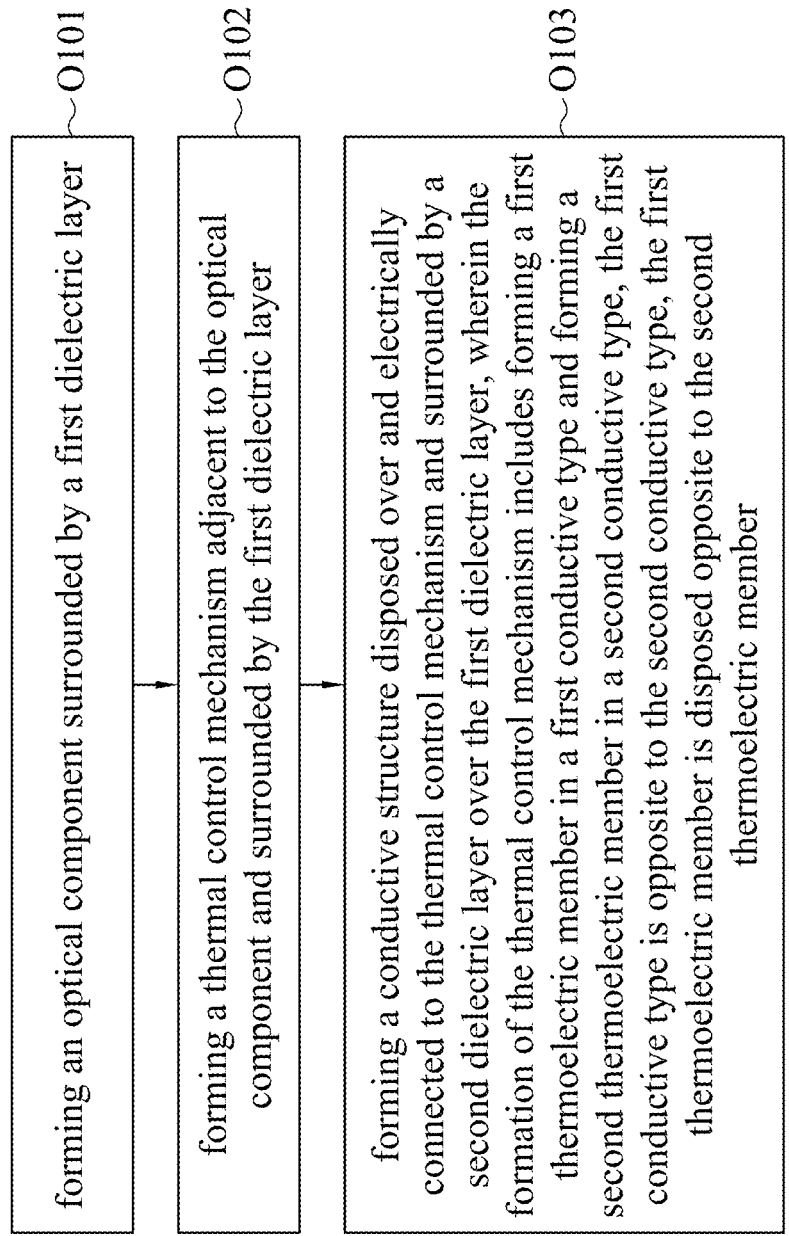
FIG. 11 is a flow diagram of a method of manufacturing a semiconductor structure in accordance with some embodiments of the present disclosure.

FIG. 11 is a flowchart of a method M10 for manufacturing a semiconductor structure in accordance with some embodiments of the present disclosure. As illustrated in FIG. 11, the method M10 includes several operations: (O101) forming an optical component surrounded by a first dielectric layer; (O102) forming a thermal control mechanism adjacent to the optical component and surrounded by the first dielectric layer; and (O103) forming a conductive structure disposed over and electrically connected to the thermal control mechanism and surrounded by a second dielectric layer over the first dielectric layer. The formation of the thermal control mechanism includes forming a first thermoelectric member of a first conductive type and forming a second thermoelectric member of a second conductive type, wherein the first conductive type is opposite to the second conductive type and the first thermoelectric member is disposed opposite to the second thermoelectric member.

FIGS. 12 to 19 are schematic cross-sectional views of a semiconductor structure during various stages of manufacturing in accordance with some embodiments of the present disclosure. In some embodiments, the method M10 is usable to form the semiconductor structure 100 as illustrated in FIG. 1.

Figure 12:
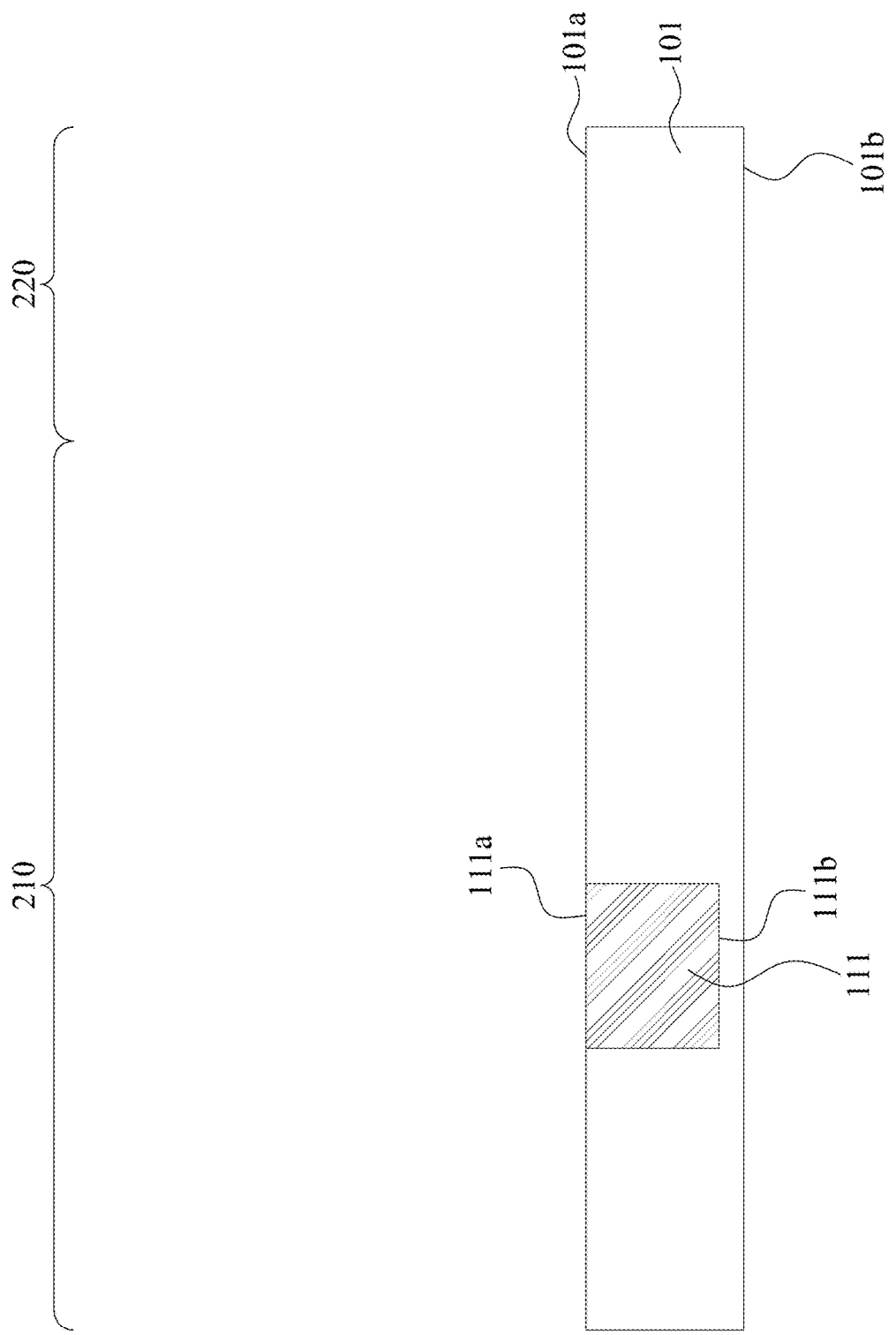
FIGS. 12 to 19 are cross-sectional views of a semiconductor structure during various stages of manufacturing in accordance with some embodiments of the present disclosure.

As illustrated in FIG. 12, in operation O101, an optical component 111 surrounded by a first dielectric layer 101 is formed. In some embodiments, the optical component 111 is embedded in the first dielectric layer 101. In some embodiments, the first dielectric layer 101 is formed by suitable fabrication techniques such as spin coating, chemical vapor deposition (CVD), plasma-enhanced chemical vapor deposition (PECVD), or the like. In some embodiments, the first dielectric layer 101 is comprised of a single layer or multiple layers stacked over each other.

In some embodiments, operation O101 further includes adjusting a first surface 111a of the optical component 111 to be coplanar with a third surface 101a of the first dielectric layer 101. In some embodiments, operation O101 further includes exposing the first surface 111a of the optical component 111 through the third surface 101a of the first dielectric layer 101.

In some embodiments, in operation O102, a thermal control mechanism 120 adjacent to the optical component 111 and surrounded by the first dielectric layer 101 is formed. FIGS. 13 and 15 to 17 illustrate the formation of the thermal control mechanism 120. In some embodiments, the formation of the thermal control mechanism 120 and formation of a first RDL 103 are performed simultaneously or separately.

Figure 13:
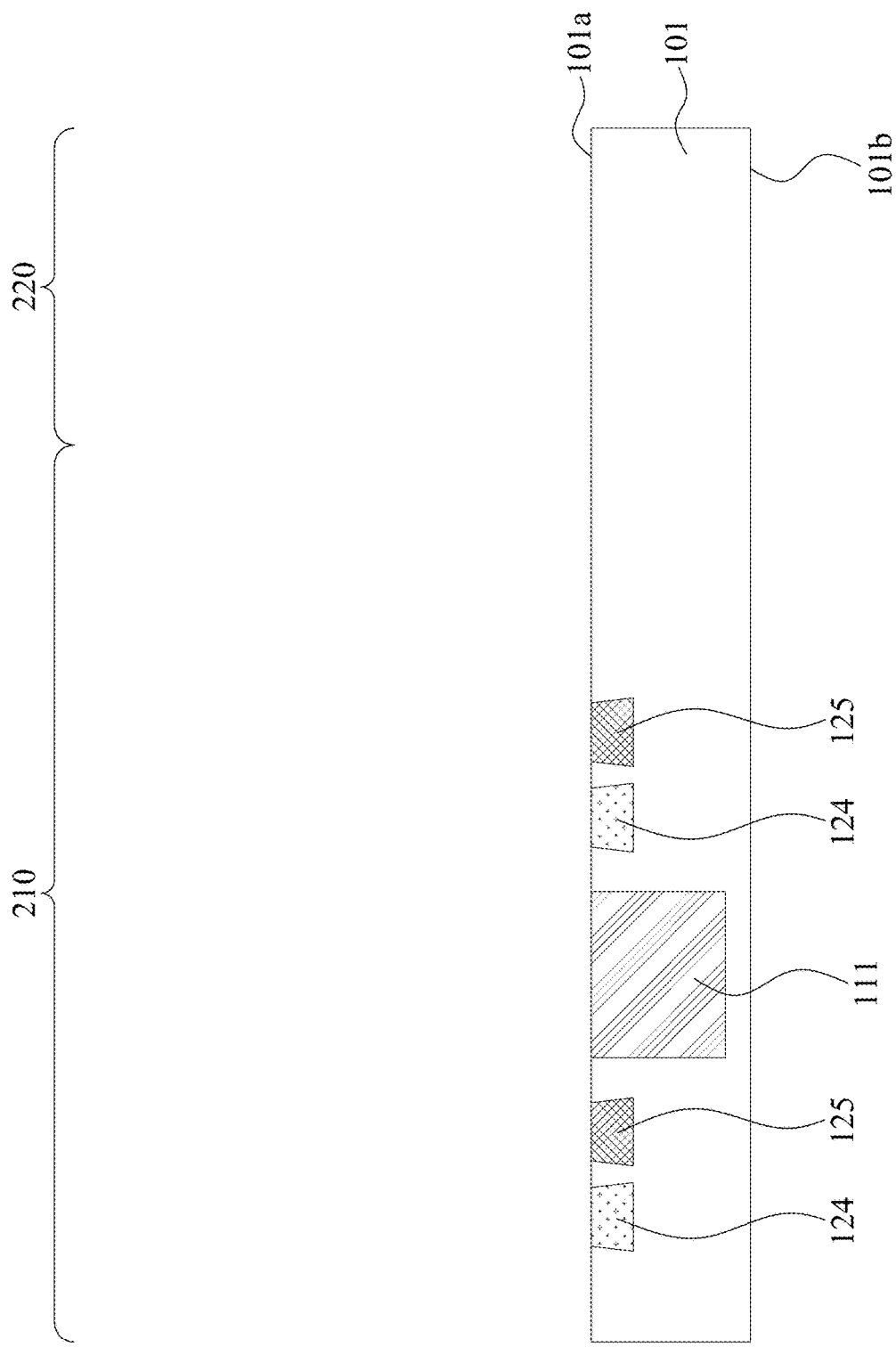

In some embodiments, referring to FIG. 13, a first thermoelectric member 124 and a second thermoelectric member 125 are disposed within the first dielectric layer 101. In some embodiments, the second thermoelectric member 125 is disposed adjacent to the first thermoelectric member 124. In some embodiments, the first thermoelectric member 124 and the second thermoelectric member 125 are formed by doping a first thermoelectric material and a second thermoelectric material different from the first thermoelectric material within openings of the first dielectric layer 101. In some embodiments, the first thermoelectric member 124 and the second thermoelectric member 125 are formed by electroplating operations. In some embodiments, the first thermoelectric member 124 and the second thermoelectric member 125 are in configurations as described above or shown in FIGS. 1 and 2. In some embodiments, top surfaces of the first thermoelectric member 124 and the second thermoelectric member 125 are substantially level or substantially coplanar with the third surface 101a of the first dielectric layer 101.

Figure 14:
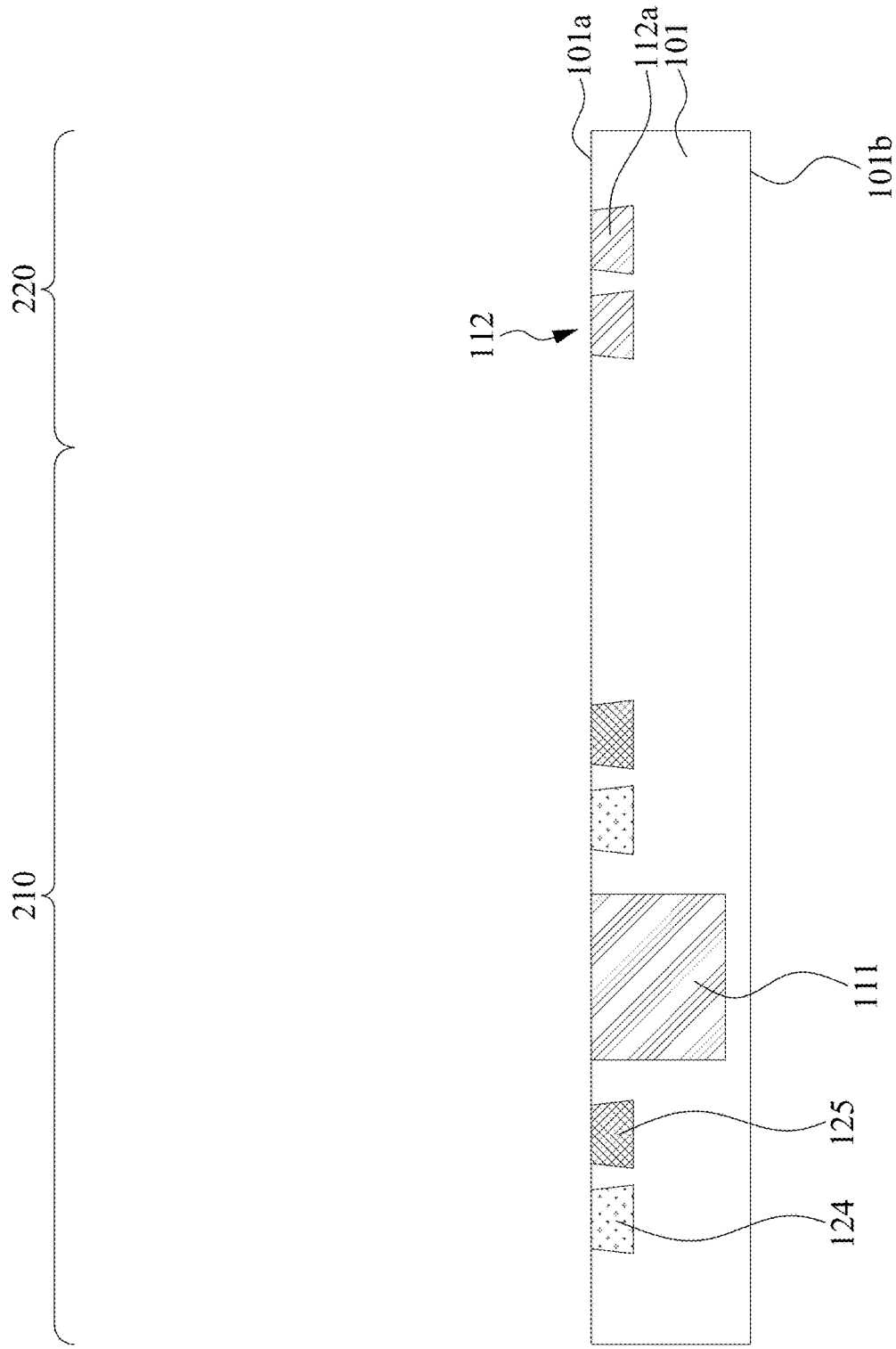

In some embodiments, referring to FIG. 14, a conductive member 112a of an electrical component 112 is disposed adjacent to the first thermoelectric member 124 and the second thermoelectric member 125. In some embodiments, the formation of the first thermoelectric member 124 and the second thermoelectric member 125 and disposition of the conductive member 112a are performed simultaneously or separately. In some embodiments, the conductive member 112a of the electrical component 112 is formed by photolithography, electroplating or any other suitable operations. In some embodiments, the disposing of the electrical component 112 includes placing the electrical component 112 such as a die over the first dielectric layer 101. In some embodiments, the electrical component 112 is in a configuration as described above or as shown in FIG. 3.

Figure 15:
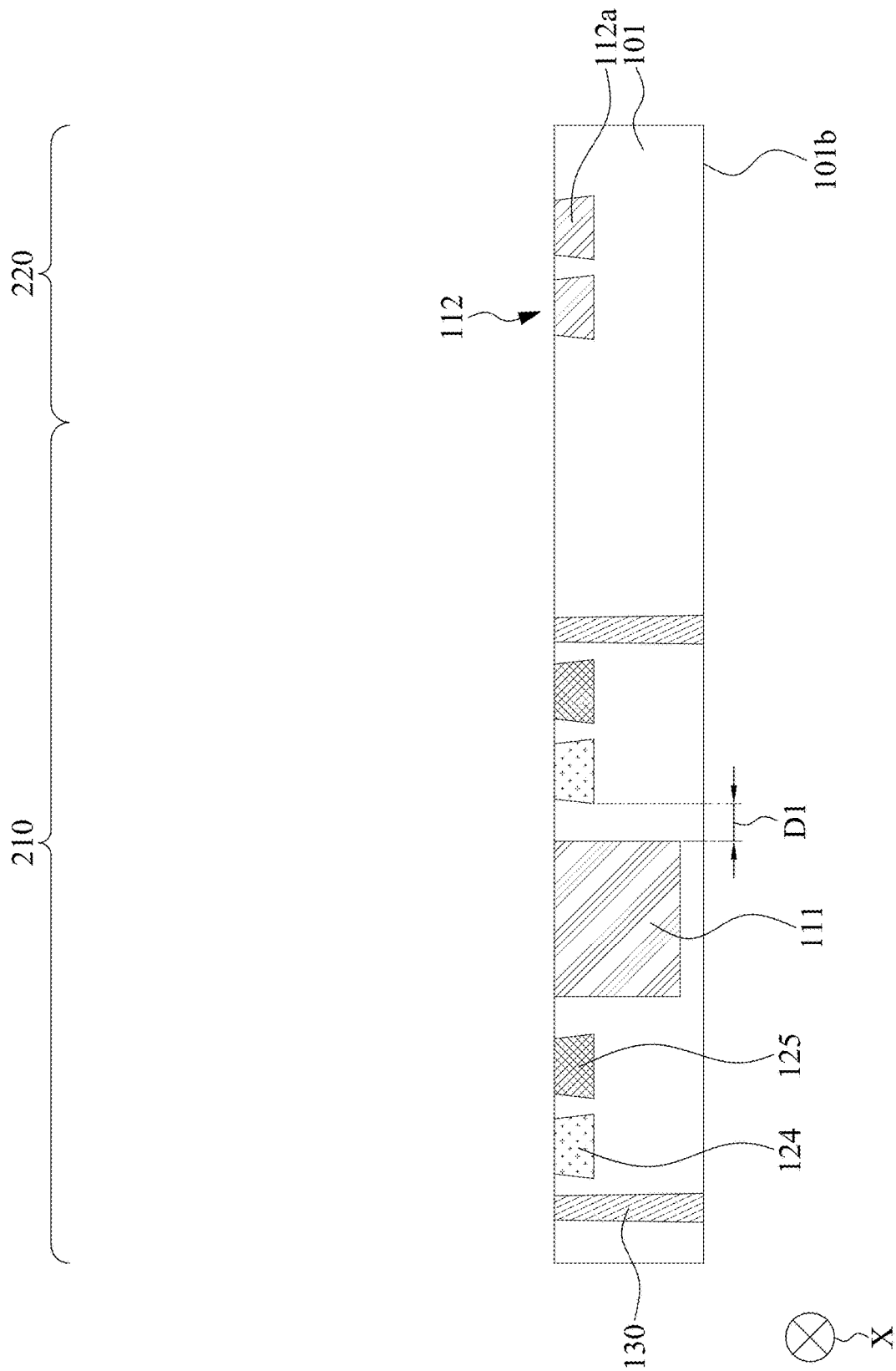

In some embodiments, referring to FIG. 15, a first via 130 is formed. In some embodiments, the first via 130 is formed by removing a portion of the first dielectric layer 101 to form an opening, and then disposing a conductive material into the opening. In some embodiments, the removal of the portion of the first dielectric layer 101 includes photolithography, etching or any other suitable operations. In some embodiments, the disposing of the conductive material includes sputtering, electroplating or any other suitable operations. In some embodiments, the first via 130 is in a configuration as described above or as illustrated in FIGS. 1 and 3.

Figure 16:
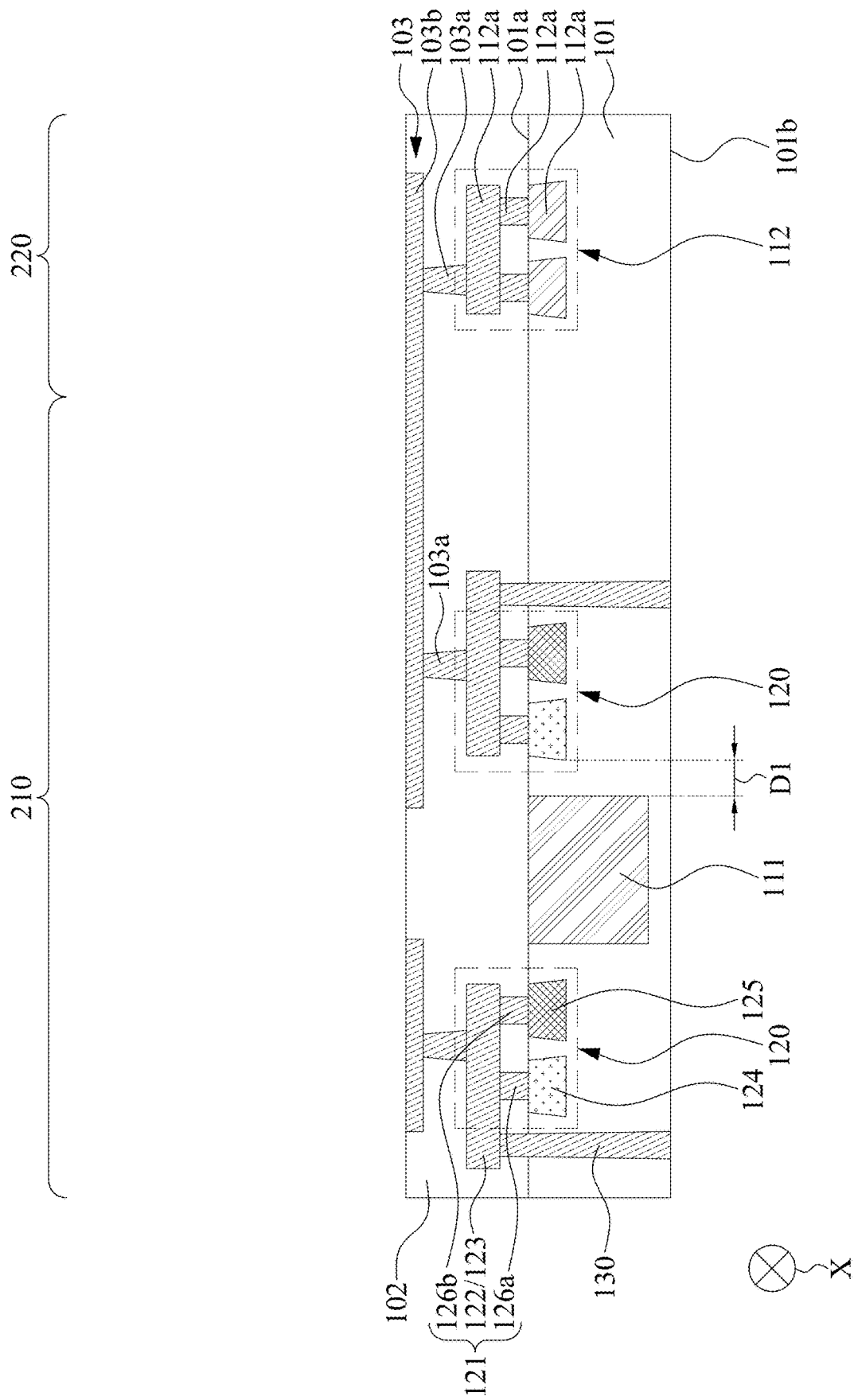

In some embodiments, referring to FIG. 16, a second dielectric layer 102 is formed over the first dielectric layer 101. In some embodiments, the second dielectric layer 102 is formed by suitable fabrication techniques such as spin coating, chemical vapor deposition (CVD), plasma-enhanced chemical vapor deposition (PECVD), or the like. In some embodiments, the second dielectric layer 102 is comprised of a single layer or multiple layers stacked over each other.

In some embodiments, a conductive structure 121, a first interconnect structure 103 are formed within the second dielectric layer 102. In some embodiments, the conductive structure 121 and the first interconnect structure 103 are in a configuration as described above or as illustrated in FIGS. 1 and 3. In some embodiments, the second via 126a, the third via 126b and a portion of the first via 130 protruding from the first dielectric layer 101 are surrounded by the second dielectric layer 102. In some embodiments, the electrical component 112 is surrounded by the first dielectric layer 101 and/or the second dielectric layer 102. In some embodiments, the first via 130, the first thermoelectric member 124 and the second thermoelectric member 125 are disposed between the electrical component 112 and the optical component 111.

In some embodiments, the first interconnect structure 103 is electrically connected to the thermal control mechanism 120 and the electrical component 112. In some embodiments, some of the pad portions 103b of the interconnect structure 103 are exposed by the second dielectric layer 102.

Figure 17:
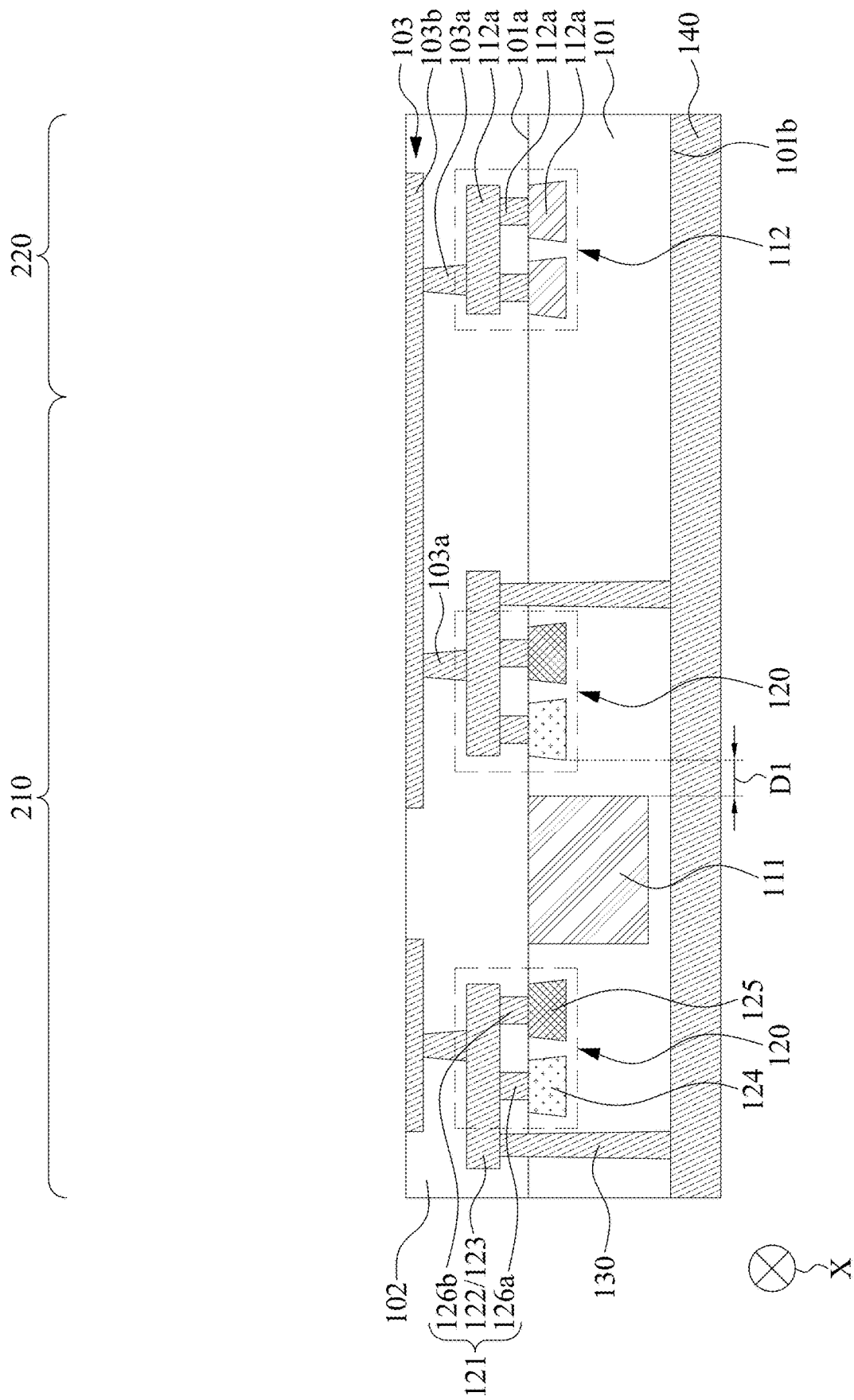

In some embodiments, referring to FIG. 17, the method M10 further includes forming a heat spreader 140 electrically connected to the first via 130. In some embodiments, the heat spreader 140 is formed under the optical component 111, the thermal control mechanism 120, the first via 130, and the electrical component 112. In some embodiments, the heat spreader 140 is formed by suitable fabrication techniques such as chemical vapor deposition (CVD), plasma-enhanced chemical vapor deposition (PECVD), or the like. In some embodiments, the heat spreader 140 is in a configuration as described above or illustrated in FIGS. 1 and 3.

Figure 18:
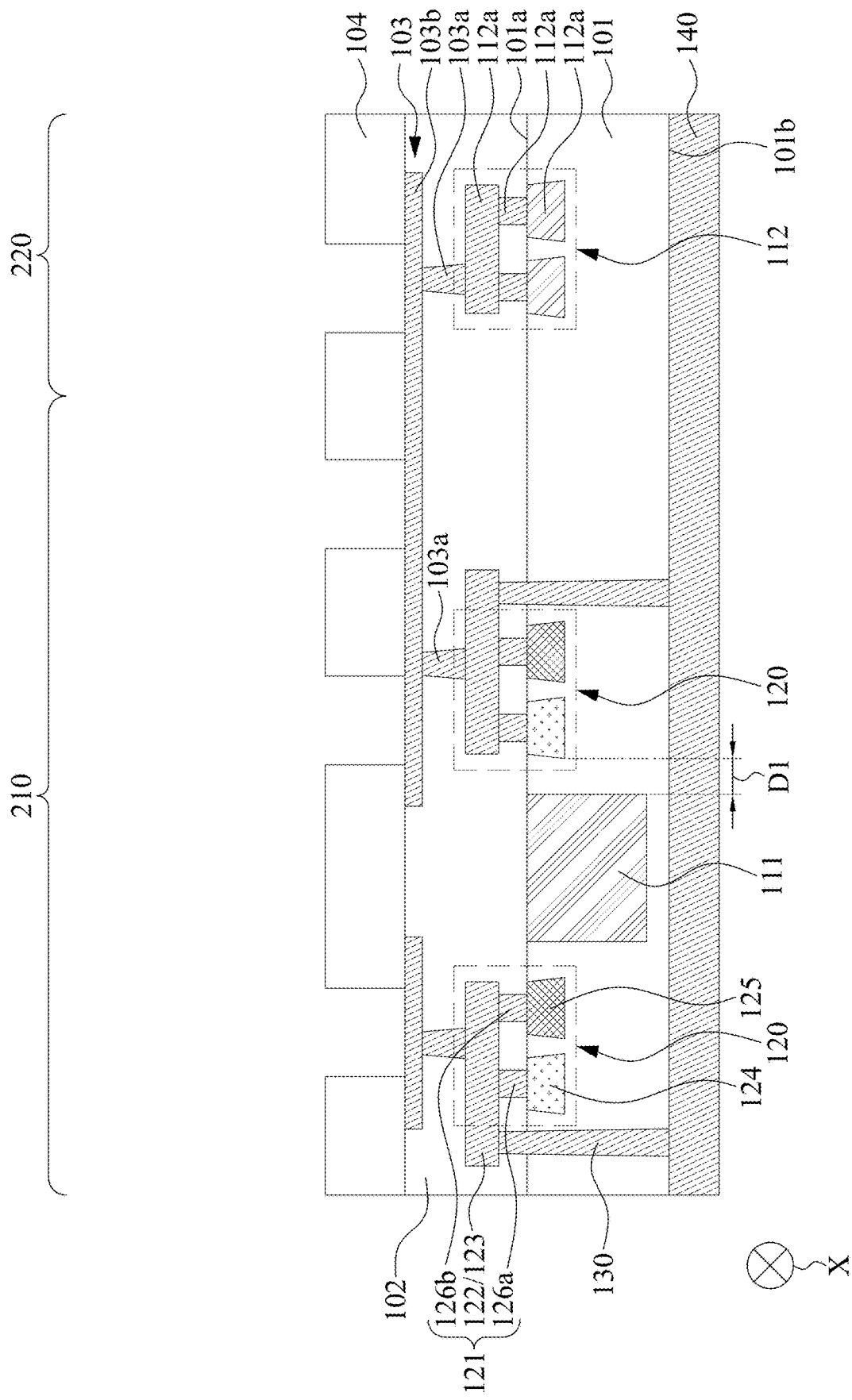

In some embodiments, referring to FIG. 18, the method M10 further includes forming a passivation layer 104 over the second dielectric layer 102 and the first interconnect structure 103. In some embodiments, some of the pad portions 103b are exposed by the passivation layer 104. In some embodiments, the passivation layer 104 is in a configuration as described above or illustrated in FIGS. 1 and 3.

Figure 19:
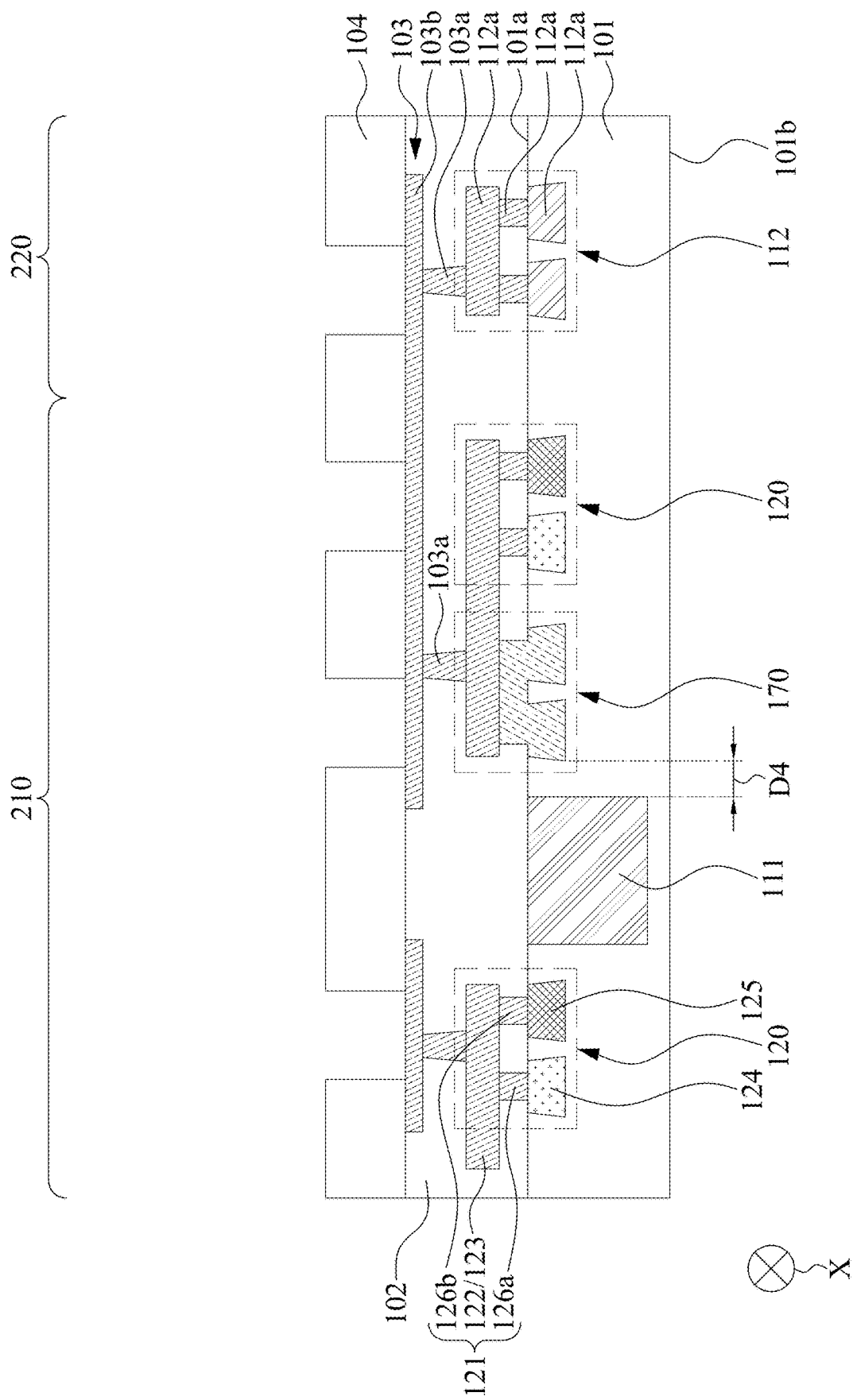

In some embodiments, referring to FIG. 19, instead of forming the first via 130 and the heat spreader 140, the method M10 further includes forming a thermal sensing circuit 170 disposed between the thermal control mechanism 120 and the optical component 111. In some embodiments, a fourth distance D4 between the thermal sensing circuit 170 and the optical component 111 is between about 0.01 μm and about 1.0 μm for optimal thermal sensing. When the distance D4 is less than 0.01 μm, the cost of the semiconductor structure 100 is too high; when the distance D4 is greater than 1.0 μm, the thermal sensing circuit 170 cannot accurately sense the condition of the optical component 111. In some embodiments, the fourth distance D4 is between about 0.02 μm and about 0.5 μm. In some embodiments, the thermal sensing circuit 170 is in a configuration as described above or illustrated in FIG. 9.

In some embodiments, the thermal sensing circuit 170 is electrically connected to the thermal control mechanism 120 and the electrical component 112 through the first interconnect structure 103. In some embodiments, the thermal sensing circuit 170 is surrounded by the thermal control mechanism 120 in a top view. In some embodiments, the formation of the thermal control mechanism 120 and the formation of the thermal sensing circuit 170 are performed simultaneously or separately.

In some embodiments, the passivation layer 104 is formed over the second dielectric layer 102 and the first interconnect structure 103. In some embodiments, some of the pad portions 103b electrically connected to the thermal sensing circuit 170 are exposed by the passivation layer 104. In some embodiments, the passivation layer 104 is in a configuration as described above or illustrated in FIG. 9.

An aspect of this disclosure relates to a semiconductor structure. The semiconductor structure includes an optical component. The semiconductor structure further includes a thermal control mechanism adjacent to the optical component and configured to control a temperature of the optical component. The thermal control mechanism includes a conductive structure, a first thermoelectric member and a second thermoelectric member opposite to the first thermoelectric member. The first thermoelectric member and the second thermoelectric member are electrically connected to the conductive structure. The first thermoelectric member and the second thermoelectric member have opposite conductive types. The semiconductor structure further includes a first dielectric layer surrounding the optical component and a portion of the thermal control mechanism, wherein the conductive structure is over the first dielectric layer, and the first thermoelectric member and the second thermoelectric member are surrounded by the first dielectric layer. The semiconductor structure further includes a first via extending through the first dielectric layer and electrically connected to the conductive structure. In some embodiments, the semiconductor structure further includes a heat spreader electrically connected to the first via, wherein the heat spreader is over the first dielectric layer. In some embodiments, the heat spreader is over a first surface of the first dielectric layer, and the conductive structure is over a second surface of the first dielectric layer opposite to the first surface. In some embodiments, the conductive structure includes a second via and a third via, wherein the second via is electrically connected to the first thermoelectric member, and the third via is electrically connected to the second thermoelectric member. In some embodiments, the semiconductor structure further includes a second dielectric layer over the optical component and the first dielectric layer, wherein the conductive structure is surrounded by the second dielectric layer. In some embodiments, the first thermoelectric member and the second thermoelectric member are electrically connected to the heat spreader through the first via and the conductive structure. In some embodiments, the thermal control mechanism surrounds the optical component. In some embodiments, the semiconductor structure further includes an electrical component electrically connected to the thermal control mechanism. In some embodiments, the thermal control mechanism is between the electrical component and the optical component. In some embodiments, the semiconductor structure further includes an electrical component between the heat spreader and the optical component. In some embodiments, the semiconductor structure further includes an electrical component, wherein the heat spreader is between the electrical component and the optical component. In some embodiments, a distance between the thermal control mechanism and the optical component ranges from about 0.01 μm to about 1.0 μm.

An aspect of this description relates to a semiconductor structure. The semiconductor structure includes an optical component. The semiconductor structure further includes an electrical component adjacent to the optical component. The semiconductor structure further includes a thermal control mechanism between the electrical component and the optical component. The semiconductor structure further includes a thermal sensing circuit between the thermal control mechanism and the optical component, wherein the thermal sensing circuit is configured to control a current direction of a current flowing through the thermal control mechanism, the thermal sensing circuit is electrically connected to the thermal control mechanism, and the thermal sensing circuit is closer to the optical component than to the electrical component. The semiconductor structure further includes a first dielectric layer surrounding the optical component, at least a portion of the electrical component, at least a portion of the thermal control mechanism, and at least a portion of the thermal sensing circuit. In some embodiments, the thermal control mechanism includes a conductive structure electrically connected to the first via and over the first dielectric layer, a first thermoelectric member, and a second thermoelectric member opposite to the first thermoelectric member, wherein the first thermoelectric member and the second thermoelectric member are surrounded by the first dielectric layer, are electrically connected to the conductive structure, and have opposite conductive types. In some embodiments, a distance between the thermal sensing circuit and the optical component ranges from about 0.01 µm to about 1.0 µm.

An aspect of this description relates to a method of manufacturing a semiconductor structure. The method includes forming a first dielectric layer surrounding an optical component. The method further includes forming a thermal control mechanism adjacent to the optical component and at least partially surrounded by the first dielectric layer. Forming the thermal control mechanism includes forming a first thermoelectric member having a first conductivity type, forming a second thermoelectric member having a second conductivity type opposite to the first conductivity type, wherein the second thermoelectric member is opposite to the first thermoelectric member; and forming a conductive structure over and electrically connected to the thermal control mechanism. The method further includes forming a second dielectric layer over the first dielectric layer and surrounding the conductive structure. In some embodiments, forming of the conductive structure includes forming a first conductive member extending between the first thermoelectric member and the second thermoelectric member, wherein the first conductive member is surrounded by the second dielectric layer; and forming a second conductive member extending between the first thermoelectric member and the second thermoelectric member and adjacent to the first conductive member, wherein the second conductive member is surrounded by the second dielectric layer. In some embodiments, each of the first thermoelectric member and the second thermoelectric member is formed by electroplating. In some embodiments, the method further includes forming a via extending through the first dielectric layer and electrically connected to the thermal control mechanism; and forming a heat spreader electrically connected to the via. In some embodiments, the method further includes disposing an electrical component adjacent to the thermal control mechanism, wherein the electrical component is surrounded by the first dielectric layer or the second dielectric layer, and the thermal control mechanism is between the electrical component and the optical component; and forming a thermal sensing circuit between the thermal control mechanism and the optical component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    an optical component;
    a thermal control mechanism adjacent to the optical component and configured to control a temperature of the optical component, wherein
        the thermal control mechanism includes a conductive structure, a first thermoelectric member and a second thermoelectric member opposite to the first thermoelectric member,
        the first thermoelectric member and the second thermoelectric member are electrically connected to the conductive structure, and
        the first thermoelectric member and the second thermoelectric member have opposite conductive types;
    a first dielectric layer surrounding the optical component and a portion of the thermal control mechanism, wherein the conductive structure is over the first dielectric layer, and the first thermoelectric member and the second thermoelectric member are surrounded by the first dielectric layer; and
    a first via extending through the first dielectric layer and electrically connected to the conductive structure.

2. The semiconductor structure of claim 1, further comprising:
    a heat spreader electrically connected to the first via, wherein the heat spreader is over the first dielectric layer.

3. The semiconductor structure of claim 2, wherein the heat spreader is over a first surface of the first dielectric layer, and the conductive structure is over a second surface of the first dielectric layer opposite to the first surface.

4. The semiconductor structure of claim 1, wherein the conductive structure includes a second via and a third via, wherein the second via is electrically connected to the first thermoelectric member, and the third via is electrically connected to the second thermoelectric member.

5. The semiconductor structure of claim 1, further comprising:
    a second dielectric layer over the optical component and the first dielectric layer,
    wherein the conductive structure is surrounded by the second dielectric layer.

6. The semiconductor structure of claim 2, wherein the first thermoelectric member and the second thermoelectric member are electrically connected to the heat spreader through the first via and the conductive structure.

7. The semiconductor structure of claim 1, wherein the thermal control mechanism surrounds the optical component.

8. The semiconductor structure of claim 1, further comprising:
    an electrical component electrically connected to the thermal control mechanism.

9. The semiconductor structure of claim 8, wherein the thermal control mechanism is between the electrical component and the optical component.

10. The semiconductor structure of claim 2, further comprising:
    an electrical component between the heat spreader and the optical component.

11. The semiconductor structure of claim 2, further comprising:
    an electrical component, wherein the heat spreader is between the electrical component and the optical component.

12. The semiconductor structure of claim 1, wherein a distance between the thermal control mechanism and the optical component ranges from about 0.01 µm to about 1.0 µm.

13. A semiconductor structure, comprising:
an optical component;
an electrical component adjacent to the optical component;
a thermal control mechanism between the electrical component and the optical component; and
a first dielectric layer surrounding the optical component, at least a portion of the electrical component, and at least a portion of the thermal control mechanism, wherein the thermal control mechanism comprises:
- a conductive structure electrically connected to a first via and over the first dielectric layer,
- a first thermoelectric member, and
- a second thermoelectric member opposite to the first thermoelectric member, wherein the first thermoelectric member and the second thermoelectric member are surrounded by the first dielectric layer, are electrically connected to the conductive structure, and have opposite conductive types.

14. The semiconductor structure of claim 13, wherein the electrical component is electrically connected to the thermal control mechanism.

15. A semiconductor structure, comprising:
an optical component;
a thermal control mechanism adjacent to the optical component and configured to control a temperature of the optical component, wherein
the thermal control mechanism includes a conductive structure, a first thermoelectric member and a second thermoelectric member opposite to the first thermoelectric member,
the first thermoelectric member and the second thermoelectric member are electrically connected to the conductive structure, and
the first thermoelectric member and the second thermoelectric member have opposite conductive types;
a first dielectric layer surrounding the optical component and a portion of the thermal control mechanism, wherein the conductive structure is over the first dielectric layer, and the first thermoelectric member and the second thermoelectric member are surrounded by the first dielectric layer;
a first via extending through the first dielectric layer and electrically connected to the conductive structure; and
an electrical component electrically connected to the thermal control mechanism.

16. The semiconductor structure of claim 15, wherein the thermal control mechanism is between the electrical component and the optical component.

17. The semiconductor structure of claim 15, wherein the optical component includes a modulator, a phase shifter, a photodiode, a waveguide, a detector, a grating, or a coupler.

18. The semiconductor structure of claim 15, wherein the electrical component is electrically connected to the thermal control mechanism by a conductive line extending in a first direction parallel to a top surface of the optical component.

19. The semiconductor device of claim 18, wherein the first thermoelectric member is between the conductive line and the conductive structure.

* * * * *